United States Patent
Uebayashi et al.

(10) Patent No.: US 11,450,801 B2
(45) Date of Patent: Sep. 20, 2022

(54) METHOD OF MANUFACTURING PIEZOELECTRIC ELEMENT, METHOD OF MANUFACTURING OSCILLATORY WAVE MOTOR, METHOD OF MANUFACTURING OPTICAL APPARATUS, AND METHOD OF MANUFACTURING ELECTRONIC APPARATUS

(71) Applicant: CANON KABUSHIKI KAISHA, Tokyo (JP)

(72) Inventors: Akira Uebayashi, Tokyo (JP); Tatsuo Furuta, Machida (JP); Kanako Oshima, Tokyo (JP); Takayuki Watanabe, Yokohama (JP); Jumpei Hayashi, Yokohama (JP); Satoshi Fujita, Utsunomiya (JP); Yuki Iitsuka, Yaita (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 493 days.

(21) Appl. No.: 16/489,270

(22) PCT Filed: Mar. 1, 2018

(86) PCT No.: PCT/JP2018/007851
§ 371 (c)(1),
(2) Date: Aug. 27, 2019

(87) PCT Pub. No.: WO2018/159772
PCT Pub. Date: Sep. 7, 2018

(65) Prior Publication Data
US 2020/0119257 A1    Apr. 16, 2020

(30) Foreign Application Priority Data

Mar. 3, 2017 (JP) .............................. JP2017-040256
Feb. 6, 2018 (JP) .............................. JP2018-019435

(51) Int. Cl.
*H01L 41/257* (2013.01)
*H02N 2/16* (2006.01)
(Continued)

(52) U.S. Cl.
CPC .............. *H01L 41/257* (2013.01); *G02B 7/04* (2013.01); *H01L 41/1871* (2013.01); *H01L 41/1873* (2013.01); *H02N 2/163* (2013.01)

(58) Field of Classification Search
CPC ............... H01L 41/257; H01L 41/1871; H01L 41/1873; H01L 41/273; G02B 7/04; G02B 7/08; H02N 2/163
See application file for complete search history.

(56) References Cited

U.S. PATENT DOCUMENTS

| 8,182,713 B2 | 5/2012 | Ren et al. |
| 11,081,637 B2 | 8/2021 | Fujii et al. |
| 2011/0031848 A1 | 2/2011 | Sakai |

FOREIGN PATENT DOCUMENTS

| EP | 2825513 B1 * | 9/2017 | ............... B08B 7/02 |
| JP | 57-85274 A | 5/1982 | |

(Continued)

OTHER PUBLICATIONS

IP.com search (Year: 2022).*

(Continued)

*Primary Examiner* — Lisa Solomon
(74) *Attorney, Agent, or Firm* — Venable LLP

(57) ABSTRACT

Provided is a method of manufacturing a piezoelectric element in which, at a time when the piezoelectric element is manufactured, a piezoelectric material is prevented from being exposed to a temperature higher than a Curie temperature thereof to be depolarized, to thereby significantly decrease piezoelectric properties. The method of manufacturing a piezoelectric element includes a first step of arrang- (Continued)

ing a plurality of electrodes on a piezoelectric material, electrically short-circuiting two or more electrodes of the plurality of electrodes, and subjecting the piezoelectric material to heat treatment, and a second step of, after the first step, electrically opening the short circuit of the two or more electrodes at a time when a temperature of the piezoelectric material decreases to less than a temperature of the piezoelectric material at a time of the heat treatment.

14 Claims, 12 Drawing Sheets

(51) Int. Cl.
*G02B 7/04* (2021.01)
*H01L 41/187* (2006.01)

(56) References Cited

FOREIGN PATENT DOCUMENTS

| JP | 57-90986 A | 6/1982 |
| JP | 11-322420 A | 11/1999 |
| JP | 2009-215111 A | 9/2009 |
| JP | 2009-268182 A | 11/2009 |
| JP | 2017-17157 A | 1/2017 |

OTHER PUBLICATIONS

P. Vijaya Bhaskar Rao et al., "Electrical Properties of K0.5Bi0.5TiO3", 467(1-2) J. Alloy Compd. 293-298 (Nov. 2007).
Notice of Reasons for Refusal in Japanese Application No. 2018-019435 (dated Apr. 2022).

\* cited by examiner

METHOD OF MANUFACTURING PIEZOELECTRIC ELEMENT, METHOD OF MANUFACTURING OSCILLATORY WAVE MOTOR, METHOD OF MANUFACTURING OPTICAL APPARATUS, AND METHOD OF MANUFACTURING ELECTRONIC APPARATUS

TECHNICAL FIELD

The present invention relates to a method of manufacturing a piezoelectric element, and methods of manufacturing an oscillatory wave motor, an optical apparatus, and an electronic apparatus each using a piezoelectric element manufactured by the method of manufacturing a piezoelectric element.

BACKGROUND ART

A commonly used piezoelectric material is an $ABO_3$ perovskite-type metal oxide, such as lead zirconate titanate (hereinafter referred to as "PZT"). However, PZT contains lead as an A-site element, and hence its effect on environments has been seen as a problem. Accordingly, a piezoelectric material using a lead-free perovskite-type metal oxide has been required.

As a piezoelectric material formed of a lead-free perovskite-type metal oxide, barium titanate has been known. Further, in order to improve the piezoelectric properties thereof, development of a material based on the composition of barium titanate has been performed. However, the lead-free perovskite-type metal oxide that has hitherto been developed has the following problems.

For example, in PTL 1, there is a disclosure of a piezoelectric material formed of a metal oxide containing barium titanate as a main component in which piezoelectric properties are improved by substituting Ca for a part of Ba serving as an element at an A-site of barium titanate and substituting Zr for a part of Ti serving as an element at a B-site thereof. However, the above-mentioned material has a Curie temperature as low as 100° C. or less with reference to FIG. 1 of PTL 1, and hence there is a risk in that the piezoelectric properties may be decreased when the material is exposed to a temperature equal to or higher than the Curie temperature.

Meanwhile, as disclosed in PTL 2, when a device using a piezoelectric element is manufactured, a power supply member, for example, a flexible printed board is connected to the piezoelectric element by thermal compression bonding, to thereby easily manufacture complicated wiring in most cases. In such cases, a piezoelectric material forming the piezoelectric element is exposed to high temperature when the power supply member is subjected to thermal compression bonding.

In view of the foregoing, there may be a high risk as described below. When a lead-free (that is, substantially containing no lead) piezoelectric material has a low Curie temperature in spite of the fact that the piezoelectric material has a large piezoelectric constant, depolarization is caused in a part of the piezoelectric element heated at a time when a power supply member is connected to the piezoelectric element by thermal compression bonding, to thereby significantly decrease piezoelectric properties.

Further, even when the piezoelectric material does not have such a low Curie temperature, in the case where the piezoelectric material is exposed to a temperature higher than the Curie temperature at a time of manufacturing or use of the piezoelectric element, there is a risk in that the piezoelectric material may be depolarized, to thereby significantly decrease piezoelectric properties. Therefore, attention needs to be constantly paid to a temperature condition at a time of manufacturing or use of the piezoelectric element.

In view of the above-mentioned problems, the present invention provides a method of manufacturing a piezoelectric element using a novel heat treatment method capable of preventing a significant decrease in piezoelectric constant of a piezoelectric material at a time when the piezoelectric element is manufactured. The present invention also provides a method of manufacturing an oscillatory wave motor, an optical apparatus, or an electronic apparatus through use of a piezoelectric element manufactured by the above-mentioned method.

CITATION LIST

Patent Literature

[PTL 1] Japanese Patent Application Laid-Open No. 2009-215111
[PTL 2] Japanese Patent Application Laid-Open No. 2009-268182

SUMMARY OF INVENTION

In order to solve the above-mentioned problems, according to one embodiment of the present invention, there is provided a method of manufacturing a piezoelectric element, including: a first step of arranging a plurality of electrodes on a piezoelectric material, electrically short-circuiting two or more electrodes of the plurality of electrodes, and subjecting the piezoelectric material to heat treatment; and a second step of, after the first step, electrically opening the short circuit of the two or more electrodes at a time when a temperature of the piezoelectric material decreases to less than a temperature of the piezoelectric material at a time of the heat treatment.

According to another embodiment of the present invention, there is provided a method of manufacturing an oscillatory wave motor, including arranging a piezoelectric element manufactured by the method of manufacturing a piezoelectric element on a vibration member and bringing a moving member into contact with the vibration member, to thereby form an oscillatory wave motor.

According to another embodiment of the present invention, there is provided a method of manufacturing an optical apparatus, including dynamically connecting an optical member to a moving member of an oscillatory wave motor manufactured by the method of manufacturing an oscillatory wave motor, to thereby form an optical apparatus.

According to another embodiment of the present invention, there is provided a method of manufacturing an electronic apparatus, including arranging a member including a piezoelectric element manufactured by the method of manufacturing a piezoelectric element, to thereby form an electronic apparatus.

Further features of the present invention will become apparent from the following description of exemplary embodiments with reference to the attached drawings.

Advantageous Effects of Invention

According to the present invention, it is possible to prevent a significant decrease in piezoelectric constant of the piezoelectric material at a time when the piezoelectric element is manufactured. In particular, even in a heat treatment step at a temperature higher than the Curie temperature of the piezoelectric material, a significant decrease in piezoelectric constant of the piezoelectric material can be prevented. Thus, when the oscillatory wave motor, the optical apparatus, or the electronic apparatus is manufactured through use of the piezoelectric element manufactured by the method of manufacturing a piezoelectric element of the present invention, it can be expected that a product excellent in terms of function can be obtained through use of the excellent piezoelectric properties of the piezoelectric element.

DESCRIPTION OF EMBODIMENTS

Now, description is given of various embodiments of a method of manufacturing a piezoelectric element of the present invention, and methods of manufacturing an oscillatory wave motor, an optical apparatus, and an electronic apparatus through use of a piezoelectric element manufactured by the method of manufacturing a piezoelectric element of the present invention.

Figure 12:
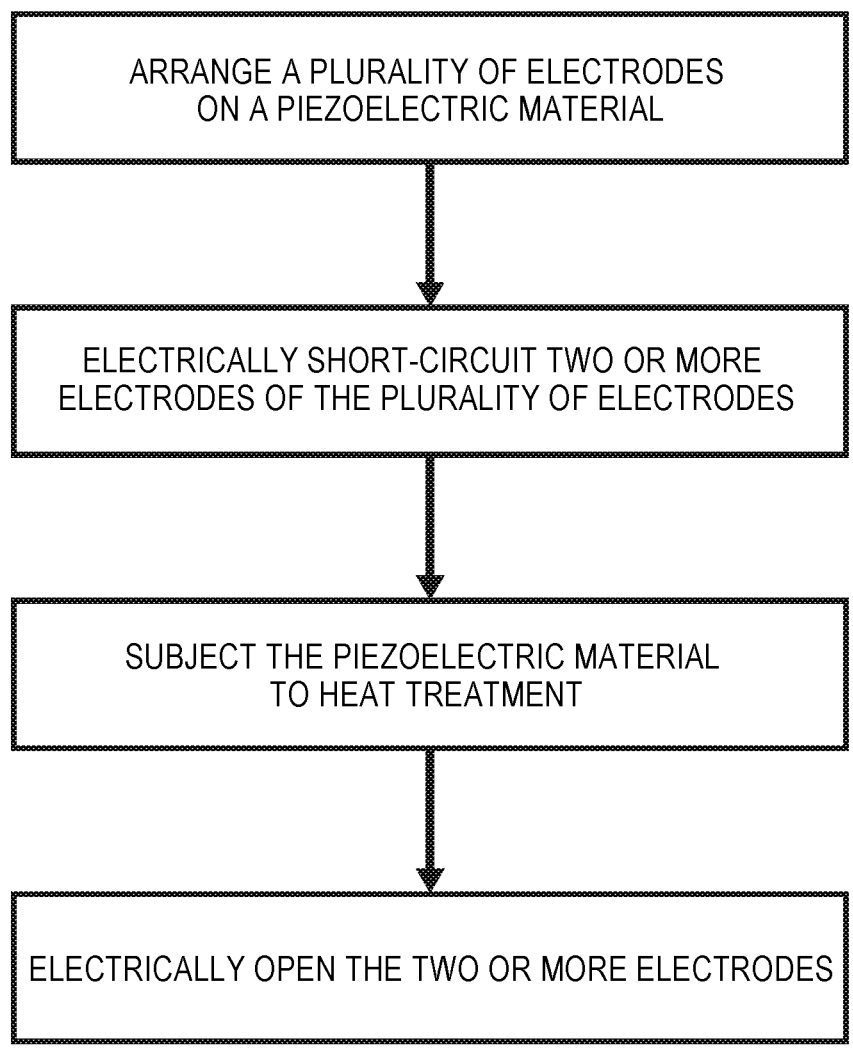
FIG. 12 is a flowchart for illustrating a manufacturing flow of the method of manufacturing a piezoelectric element of the present invention.

The method of manufacturing a piezoelectric element of the present invention includes a first step of arranging a plurality of electrodes on a piezoelectric material, electrically short-circuiting two or more electrodes of the plurality of electrodes, and subjecting the piezoelectric material to heat treatment, and a second step of, after the first step, electrically opening the short circuit of the two or more electrodes. FIG. 12 is a flowchart for illustrating a manufacturing flow of the method of manufacturing a piezoelectric element of the present invention.

(Piezoelectric Material)

A piezoelectric material forming the piezoelectric element manufactured by the manufacturing method of the present invention may have any forms, such as ceramics (bulk body of a polycrystal), a single crystal, and a thin film. There are no particular limitations on a substance and a production method, but it is preferred that the piezoelectric material be made of ceramics. The term "ceramics" as used herein refers to an aggregate of crystal grains that contains a metal oxide as a basic component and is baked by heat treatment, that is, a bulk body of a polycrystal. The ceramics also encompasses those processed after being sintered. The present invention is described below by way of an exemplary embodiment using ceramics as the piezoelectric material.

The ceramics serving as the piezoelectric material to be used in the method of manufacturing a piezoelectric element of the present invention is not particularly limited, and for example, a piezoelectric ceramics, such as lead zirconate titanate (PZT), barium titanate, calcium barium titanate, sodium bismuth titanate, lead titanate, lithium niobate, sodium potassium niobate, or bismuth ferrate, a piezoelectric ceramics containing the component as a main component, or a piezoelectric ceramics formed of a solid solution of sodium niobate and a small amount of barium titanate may be used. Here, there is no particular limitation on a ratio between sodium niobate and barium titanate in the solid solution, but the ratio between sodium niobate and barium titanate may be represented as, for example, 88:12 or 90:10.

A piezoelectric material, to which the method of manufacturing a piezoelectric element of the present invention is particularly preferably applied, is a lead-free piezoelectric material containing lead at a content of less than 1,000 ppm. Of those, a piezoelectric ceramics made of a metal oxide containing barium titanate as a main component is particularly preferred. Most of the related-art piezoelectric materials forming piezoelectric elements are each a piezoelectric ceramics containing lead zirconate titanate as a main component. Therefore, it has been pointed out that, in the case where such piezoelectric material is used, for example, when the piezoelectric element is discarded to be exposed to acid rain or left in a severe environment, there is a risk in that the lead component in the piezoelectric material seeps into soil, thereby adversely affecting the ecosystem. However, with the piezoelectric material made of a metal oxide containing barium titanate as a main component, the piezoelectric material containing lead at a content of less than 1,000 ppm, there is a low risk in that the lead component contained in the piezoelectric material adversely affects the environment even when the piezoelectric element is discarded to be exposed to acid rain or left in a severe environment. In addition, out of the piezoelectric ceramics containing no lead components, a piezoelectric ceramics containing barium titanate as a main component exhibits a large absolute value of a piezoelectric constant d. Therefore, a voltage required for obtaining the same strain amount can be decreased.

(Piezoelectric Element)

Figure 1:
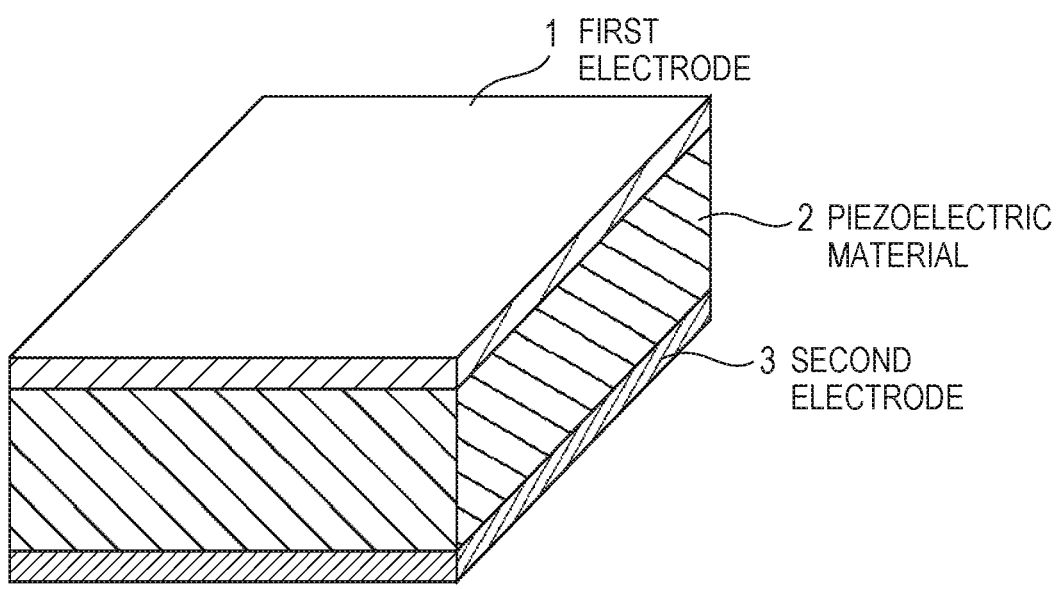
FIG. 1 is a schematic perspective view for schematically illustrating an exemplary configuration of a configuration of a piezoelectric element manufactured by a manufacturing method of the present invention.

FIG. 1 is a schematic perspective view for illustrating an example of a configuration of the piezoelectric element manufactured by the manufacturing method of the present invention. The piezoelectric element of FIG. 1 has at least a structure in which a piezoelectric material 2 is interposed between a first electrode 1 and a second electrode 3. The piezoelectric element of FIG. 1 is described below. However, the piezoelectric element manufactured by the manufacturing method of the present invention is not limited to the configuration of the piezoelectric element of FIG. 1. For example, the piezoelectric element may include three or more electrodes, or two electrodes may be arranged on one surface of the piezoelectric material. For example, a piezoelectric element having an annular shape to be used in a stator for an oscillatory wave motor includes three or more electrodes as illustrated in FIG. 8A to FIG. 8E. When the piezoelectric element has at least the structure in which the piezoelectric material is interposed between the first electrode and the second electrode, for example, an alternating voltage can be applied to the piezoelectric material. Further, the piezoelectric properties of the piezoelectric material interposed between the first electrode and the second electrode can also be evaluated by investigating the behavior of the piezoelectric material at a time when the voltage is applied between the first electrode and the second electrode. The first electrode and the second electrode are each formed of a conductive layer having a thickness of from about 5 nm to about 10 μm, and the resistance value thereof in a thickness direction is desirably less than 10Ω, preferably less than 1Ω.

There are no particular limitations on materials for the electrodes and to be arranged on the piezoelectric layer except that materials each exhibiting the above-mentioned resistance value are preferred, and those which are generally used in the piezoelectric element may be used. Examples thereof may include metals, such as Ti, Pt, Ta, Ir, Sr, In, Sn, Au, Al, Fe, Cr, Ni, Pd, Ag, and Cu, and compounds containing the metals. Each of the first electrode and the second electrode may be formed of one kind of those materials, or may be obtained by stacking two or more kinds thereof. In addition, the first electrode and the second electrode may be formed of materials different from each other.

A method of forming each of the first electrode and the second electrode is not limited. Each of the first electrode and the second electrode may be formed by baking a metal paste, or may be formed by sputtering, vapor deposition, or the like. In addition, both the first electrode and the second electrode may be patterned in desired shapes.

The piezoelectric element according to the present invention may be a multilayered piezoelectric element in which piezoelectric material layers and electrode layers including an internal electrode (layer) are laminated alternately.

Figure 2A:
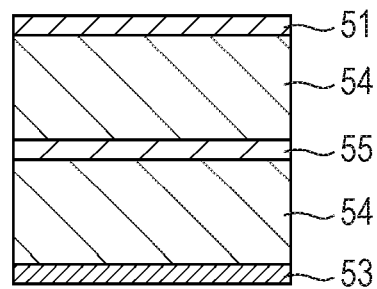
FIG. 2A is a schematic sectional view for schematically illustrating an exemplary configuration of a multilayered piezoelectric element manufactured by the manufacturing method of the present invention.
Figure 2B:
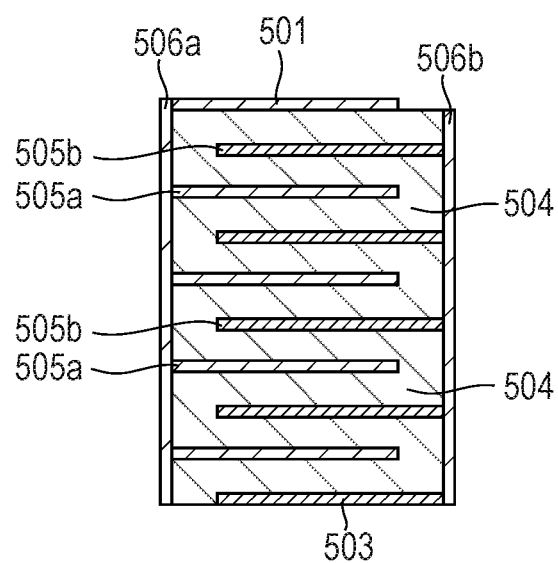
FIG. 2B is a schematic sectional view for schematically illustrating another exemplary configuration of a multilayered piezoelectric element manufactured by the manufacturing method of the present invention.

FIG. 2A and FIG. 2B are schematic sectional views for schematically illustrating examples of various configurations of a multilayered piezoelectric element manufactured by the manufacturing method of the present invention. A multilayered piezoelectric element of FIG. 2A includes two piezoelectric material layers 54 and three electrode layers, and has a structure in which the piezoelectric material layers 54 and the electrode layers are laminated alternately. The two piezoelectric material layers 54 are each made of the piezoelectric material as described above. The three electrode layers include an internal electrode 55 in addition to a first electrode 51 and a second electrode 53 serving as external electrodes.

Meanwhile, in a multilayered piezoelectric element of FIG. 2B, nine piezoelectric material layers 504 and eight internal electrodes 505 (505a and 505b) are laminated alternately. The multilayered structure is further sandwiched between a first electrode 501 and a second electrode 503, and further includes external electrodes 506 (506a and 506b) for short-circuiting the alternately formed internal electrodes 505 (505a and 505b). Thus, in the multilayered piezoelectric element manufactured by the manufacturing method of the present invention, there is no upper limit to the number of the piezoelectric material layers and the internal electrodes.

In the multilayered piezoelectric elements illustrated in FIG. 2A and FIG. 2B, the sizes and shapes of the internal electrodes 55 and 505, the external electrodes 506, the first electrodes 51 and 501, and the second electrodes 53 and 503 are not required to be the same as those of the piezoelectric material layers 54 and 504, and each electrode may be divided into a plurality of parts.

The internal electrodes 55 and 505, the external electrodes 506, the first electrodes 51 and 501, and the second electrodes 53 and 503 are each formed of a conductive layer having a thickness of from about 5 nm to about 10 µm. A material therefor is not particularly limited and only needs to be one to be generally used for a piezoelectric element as described above. Examples thereof may include metals, such as Ti, Pt, Ta, Ir, Sr, In, Sn, Au, Al, Fe, Cr, Ni, Pd, Ag, and Cu, and compounds containing the metals. Each of the internal electrodes 55 and 505, and the external electrodes 506 may be formed of one kind of those materials, may be formed of a mixture or alloy of two or more kinds thereof, or may be obtained by stacking two or more kinds thereof. In addition, the plurality of electrodes may be formed of materials different from each other.

The internal electrodes 55 and 505 each contain Ag and Pd, and a weight ratio M1/M2 between the content weight M1 of Ag and the content weight M2 of Pd is preferably $0.25 \leq M1/M2 \leq 4.0$. A case in which the weight ratio M1/M2 is less than 0.25 is not desired because the sintering temperature of the internal electrode increases. Meanwhile, a case in which the weight ratio M1/M2 is more than 4.0 is not desired because the internal electrode becomes island-shaped, resulting in in-plane non-uniformity. It is more preferred that the ratio M1/M2 satisfy $0.3 \leq M1/M2 \leq 3.0$.

From the viewpoint that the electrode material is inexpensive, it is preferred that the internal electrodes 55 and 505 each contain at least any one of Ni and Cu as a main component. When at least any one of Ni and Cu is used in each of the internal electrodes 55 and 505, it is preferred that the multilayered piezoelectric element of the present invention be baked in a reducing atmosphere.

As illustrated in FIG. 2B, a plurality of electrodes including the internal electrodes 505 may be short-circuited to each other for the purpose of making the phase of a driving voltage uniform. For example, all the internal electrodes 505a and the first electrode 501 may be short-circuited through the external electrode 506a, and all the internal electrodes 505b and the second electrode 503 may be short-circuited through the external electrode 506b. It is preferred that the plurality of internal electrodes 505a and the plurality of internal electrodes 505b be arranged alternately. Further, a mode in which the electrodes are short-circuited to each other is not limited. An electrode or wiring for short-circuiting may be arranged on a side surface of the multilayered piezoelectric element. Alternatively, the electrodes may be short-circuited to each other by arranging a through-hole passing through the piezoelectric material layers 504 and arranging a conductive material inside the through hole.

(Spontaneous Polarization Axes and Polarization Treatment)

It is preferred that the piezoelectric material to be used in the method of manufacturing a piezoelectric element of the present invention have remnant polarization (polarization remaining at a time when an external electric field is set to 0), and in particular, spontaneous polarization axes be aligned in a certain direction. Here, the spontaneous polarization axis refers to the direction of spontaneous polarization in each crystal grain of a polycrystal forming ceramics serving as the piezoelectric material. The alignment of the spontaneous polarization axes in a certain direction means that the spontaneous polarizations in the respective crystal grains are directed substantially in the same direction. When the spontaneous polarization axes are aligned in a certain direction, the piezoelectric constant of the piezoelectric element increases. Whether or not the spontaneous polarization axes are aligned in a certain direction may be confirmed, for example, by measuring the amount of charge generated at a time of application of a stress through use of a $d_{33}$ meter. When the sign of a charge amount measured with the $d_{33}$ meter under the condition that the piezoelectric element is set so that the first electrode is arranged on an upper side is opposite to the sign of a charge amount measured with the $d_{33}$ meter under the condition that the piezoelectric element is set so that the second electrode is arranged on an upper side, it can be said that the spontaneous polarization axes are aligned in a certain direction.

The ceramics is generally a collection of fine crystals (grains), and each crystal is formed of atoms each having positive charge and atoms each having negative charge. Most of the ceramics each have a state in which the center of the positive charge and the center of the negative charge are not displaced in each crystal. However, of the ceramics, there is a ferroelectric ceramics in which the center of the positive charge and the center of the negative charge are displaced in each crystal even in a natural state (state in which an external electric field is not applied), and the bias (spontaneous polarization) of the charge occurs.

In a ferroelectric ceramics after being baked, the directions of the spontaneous polarizations are random, and it appears that there is no bias of the charge in the ceramics as a whole. However, when a high voltage is applied to the ferroelectric ceramics, the directions of the spontaneous polarizations are aligned in a certain direction and do not return to the original directions even when the voltage is removed. The alignment of the directions of the spontaneous polarizations for aligning the spontaneous polarization axes in a certain direction as described above is generally referred to as "polarization treatment". In addition, when a voltage is applied from the outside to the ferroelectric ceramics subjected to the polarization treatment, the center of the positive charge and the center of the negative charge in the ceramics, and external charge attract or repel each other, and the ceramics main body expands or contracts (inverse piezoelectric effect).

A polarization treatment method for the piezoelectric material forming the piezoelectric element is not particularly limited. The polarization treatment may be performed in the air or may be performed in silicone oil. An optimum condition for a temperature at which the polarization treatment is performed varies depending on the composition of the piezoelectric material forming the piezoelectric element. For example, in a piezoelectric material made of a metal oxide containing barium titanate as a main component, it is preferred that the polarization treatment be performed at a temperature of from 80° C. to 150° C. in the vicinity of its Curie temperature. Further, it is preferred that an electric field to be applied for performing the polarization treatment be from 800 V/mm to 2.0 kV/mm.

(Curie Temperature)

The Curie temperature Tc generally refers to a temperature represented in degrees Celsius (° C.) at or above which the piezoelectricity of the piezoelectric material is lost. Herein, a temperature at which a dielectric constant becomes maximum in the vicinity of a phase transition temperature between a ferroelectric phase (tetragonal phase) and a paraelectric phase (cubic phase) is defined as the Tc. The Curie temperature Tc of the piezoelectric material made of a metal oxide containing barium titanate as a main component is from about 100° C. to about 130° C. The dielectric constant may be measured, for example, by applying an AC electric field having a frequency of 1 kHz and an electric field intensity of 10 V/cm through the use of an impedance analyzer.

(Piezoelectric Constant)

The piezoelectric constant of the piezoelectric element may be determined from the measurement results of a resonant frequency and an antiresonant frequency obtained through use of a commercially available impedance analyzer by calculation based on Japan Electronics and Information Technology Industries Association Standards (JEITA EM-4501). This method is hereinafter referred to as "resonant-antiresonant method". Further, herein, a value of the piezoelectric constant d before the heat treatment is defined as $d_{before}$, a value of the piezoelectric constant d after the heat treatment is defined as $d_{after}$, and a ratio $d_{after}/d_{before}$ of $d_{after}$ with respect to $d_{before}$ is defined as a piezoelectric constant retention ratio before and after the heat treatment. The piezoelectric constant retention ratio before and after the heat treatment is preferably 50% or more, more preferably 80% or more. When the piezoelectric constant retention ratio before and after the heat treatment is 80% or more, the piezoelectric properties of the piezoelectric material can be sufficiently exhibited.

(Short Circuit)

Electrically short-circuiting electrodes means, for example, in the piezoelectric element of FIG. 1, connecting the first electrode 1 and the second electrode 3 to each other through a conductor having resistance that is relatively smaller than a resistance value of the piezoelectric material 2. There is no particular limitation on an absolute value of the resistance of the conductor. A material therefor is not particularly limited as long as the material can be removed later. Examples thereof may include metals, such as Ti, Pt, Ta, Ir, Sr, In, Sn, Au, Al, Fe, Cr, Ni, Pd, Ag, and Cu, and compounds containing the metals. As another method, the following may be performed. A patterned member, for example, a flexible printed board is brought into contact with each of the electrodes, and the electrodes are short-circuited by wrapping a conductor exposed portion of the flexible printed board with, for example, aluminum foil, or short circuit treatment is performed through a connector. Alternatively, the short circuit treatment may be performed through use of a tool capable of being directly brought into contact with each of the electrodes.

(Heat Treatment)

The heat treatment refers to applying heat to a piezoelectric material from the outside to increase the temperature of the piezoelectric material to room temperature (for example, 25° C.) or more. A temperature increase method and the like are not limited. Regarding the heat treatment temperature, for example, when a flexible printed board is connected to the piezoelectric material by thermal compression bonding through use of an anisotropic conductive paste (ACP) or an anisotropic conductive film (ACF), the temperature of the piezoelectric material reaches a temperature of from 120° C. to 160° C. Further, for example, when a piezoelectric element is manufactured by using a reflow soldering method using lead-free solder, the piezoelectric material is heated to from 150° C. to 260° C. The temperature of the piezoelectric material may be measured through use of a known temperature measurement unit, for example, a thermocouple. In the following, the temperature of the surface of a piezoelectric material may be described, but the temperature may be measured in any manner as long as the temperature of the piezoelectric material is represented.

When Ag is used as an electrode material arranged on the piezoelectric material, the surface of the electrode may react with a sulfur compound in the air to generate silver sulfide. The generated silver sulfide has no conductivity, and hence there is a risk in that the resistance value of the electrode may increase to influence the piezoelectric properties. As a method of removing the silver sulfide generated on the surface of the electrode, there is given, for example, annealing at a temperature of about 300° C. in a reducing atmosphere.

As the temperature increase method, there are given, for example, a method involving directly heating the piezoelectric material on a hot plate and a method involving setting the piezoelectric material in a heated space, for example, a drying furnace or a reducing furnace.

In the method of manufacturing a piezoelectric element of the present invention, a maximum reaching temperature of the piezoelectric material at a time of the heat treatment may slightly exceed the Curie temperature Tc of the piezoelectric material, but should not exceed the Curie temperature Tc to a very large extent. Specifically, it is preferred that the maximum reaching temperature of the piezoelectric material at a time of the heat treatment fall within a range of Tc+50° C. or less with respect to the Curie temperature Tc of the piezoelectric material. Further, it is more preferred that the maximum reaching temperature of the piezoelectric material at a time of the heat treatment fall within a range of from Tc−50° C. to Tc+30° C. with respect to the Curie temperature Tc of the piezoelectric material. When the maximum reaching temperature of the piezoelectric material falls within the above-mentioned range, depolarization at a time of the heat treatment can be significantly suppressed.

Thus, an allowable maximum reaching temperature varies depending on the Curie temperature of the piezoelectric material to be subjected to the heat treatment. In the case of a piezoelectric material made of a metal oxide containing barium titanate as a main component, it is preferred that the allowable maximum reaching temperature be 80° C. or more and 150° C. or less. In the case of a piezoelectric material formed of a solid solution of sodium niobate and a small amount of barium titanate, it is preferred that the allowable maximum reaching temperature be 150° C. or more and 250° C. or less. Further, in the case of a lead zirconate titanate material, which is not a lead-free material, it is preferred that the allowable maximum reaching temperature be 280° C. or more and 350° C. or less.

It is appropriate that a retention time at the maximum reaching temperature at a time of the heat treatment be shorter from the viewpoint of depolarization. For example, a preferred range of the retention time is from about 1 second to about 10 minutes, though the preferred range also depends on the relationship between the maximum reaching temperature and the Curie temperature Tc of the piezoelectric material.

When the piezoelectric material subjected to the polarization treatment is subjected to the heat treatment, the piezoelectric material is partially depolarized in some cases even at the Curie temperature or less. The depolarization refers to a phenomenon in which the aligned state of the spontaneous polarization axes aligned in a certain direction is disturbed by thermal vibration. When the depolarization occurs, the piezoelectric constant decreases.

In the method of manufacturing a piezoelectric element of the present invention, at a time of the heat treatment, the heat treatment is performed after the two or more electrodes arranged on the piezoelectric material are short-circuited, and the short circuit of the electrodes is electrically opened preferably after cooling. Thus, the depolarization can be significantly suppressed.

This is probably because of the following reason. The piezoelectric material eliminates a potential difference caused due to a pyroelectric effect through the short circuit, to thereby reduce the energy for disturbing the aligned state of the spontaneous polarization axes. The pair of electrodes to be short-circuited is arranged preferably in a direction crossing the spontaneous polarization axes, more preferably in a direction perpendicular to the spontaneous polarization axes.

(Opening)

Electrically opening the short circuit of the electrodes means removing the short-circuited materials and the tool, to thereby return the short-circuited state to a state in which the electrodes are insulated from each other through intermediation of the piezoelectric material. The insulated state as used herein means that, for example, in the case of the piezoelectric element of FIG. 1, a resistance value between the first electrode 1 and the second electrode 3 is 1 MΩ or more. The resistance value is more preferably 1 GΩ or more.

In the method of manufacturing a piezoelectric element of the present invention, the piezoelectric constant retention ratio before and after the heat treatment can be arbitrarily changed by changing the temperature at a time of electrically opening the short circuit of the electrodes. That is, when the short circuit of the electrodes is opened at a time when the temperature of the piezoelectric material reaches the maximum reaching temperature at a time of the heat treatment and then decreases to a predetermined temperature, the piezoelectric constant retention ratio before and after the heat treatment can be changed by changing the predetermined temperature.

It is preferred that the short circuit of the electrodes be electrically opened generally at a time when the temperature of the piezoelectric material decreases to the Curie temperature Tc or less. The piezoelectric constant retention ratio before and after the heat treatment can be increased by electrically opening the short circuit of the electrodes at the Curie temperature or less.

It is more preferred that the temperature at which the short circuit of the electrodes is electrically opened be Tc/2 or less. When the short circuit of the electrodes is electrically opened at a time when the temperature reaches Tc/2 or less, the piezoelectric constant retention ratio before and after the heat treatment can be set to 80% or more. For example, in the case of a piezoelectric material made of a metal oxide containing barium titanate as a main component, when the short circuit is electrically opened at 55° C. or less, the piezoelectric constant retention ratio before and after the heat treatment can be set to 80% or more.

(Flexible Printed Board)

The flexible printed board refers to a printed wiring board that is formed of a thin and soft insulating material (plastic film, polyimide, or the like) and a conductive metal, for example, copper foil, and that has a structure capable of being easily bent. As disclosed in PTL 2, the flexible printed board is used often in electronic apparatus.

In the method of manufacturing a piezoelectric element of the present invention, the flexible printed board can be used as a power supply member for the piezoelectric element. The flexible printed board has high dimensional accuracy and can also be easily positioned through use of a jig or the like. Therefore, it is possible to suppress quality loss caused by variations in piezoelectric performance that occur owing to variations of a position at which the power supply member is connected to the piezoelectric element, and the like. The flexible printed board may be connected to the piezoelectric element by thermal compression bonding through use of an epoxy-based adhesive or the like. However, it is preferred that the flexible printed board be connected to the piezoelectric element by thermal compression bonding through use of an anisotropic conductive paste (ACP) or an anisotropic conductive film (ACF) having conductivity from the viewpoint of mass productivity because a conduction failure can be reduced, and a process speed can be increased.

The method of manufacturing a piezoelectric element of the present invention can be implemented by wrapping a conductor exposed portion of the flexible printed board with, for example, aluminum foil, or by subjecting the flexible printed board to thermal compression bonding under a state in which the conductor exposed portion is short-circuited with a tool using a connector terminal.

In addition, for example, even in the case where the flexible printed board is connected, by thermal compression bonding, to a piezoelectric material having a Curie temperature lower than a thermal compression bonding temperature of the flexible printed board as in a metal oxide containing barium titanate as a main component, when the method of manufacturing a piezoelectric element of the present invention is applied, a decrease in piezoelectric constant $d_{after}$ can be prevented.

(Oscillatory Wave Motor)

A method of manufacturing an oscillatory wave motor of the present invention includes arranging a piezoelectric element manufactured by the method of manufacturing a piezoelectric element of the present invention on a vibration member, and bringing a moving member into contact with the vibration member.

Arranging the piezoelectric element on the vibration member means, for example, a state in which the piezoelectric element and the vibration member are bonded to each other with an organic adhesive. Further, bringing the moving member into contact with the vibration member means a state in which a frictional force occurs between the surface of the vibration member and the surface of the moving member, and the vibration member and the moving member can be configured so as to be brought into pressure contact with each other, for example, through use of a pressurizing force of a pressure spring.

Figure 3A:
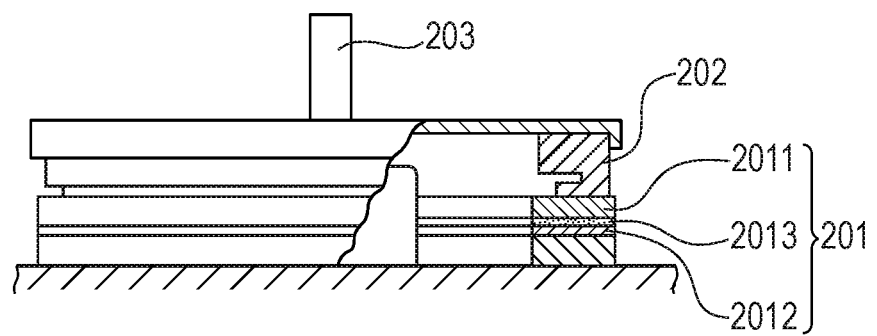
FIG. 3A is a schematic (partial) sectional view for schematically illustrating an exemplary configuration of an oscillatory wave motor manufactured by a manufacturing method of the present invention.
Figure 3B:
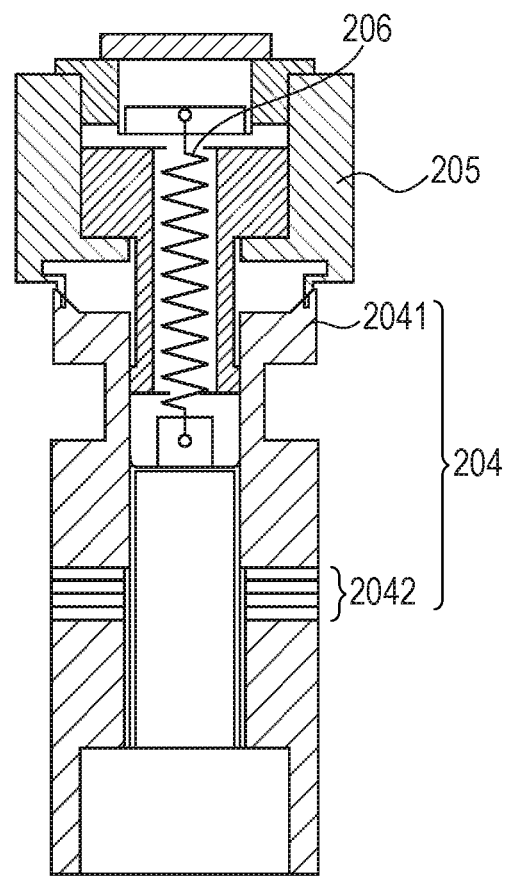
FIG. 3B is a schematic (partial) sectional view for schematically illustrating another exemplary configuration of an oscillatory wave motor manufactured by a manufacturing method of the present invention.

FIG. 3A and FIG. 3B are schematic (partial) sectional views for schematically illustrating examples of various configurations of an oscillatory wave motor manufactured by the method of manufacturing an oscillatory wave motor of the present invention. FIG. 3A is an illustration of an oscillatory wave motor in which a piezoelectric element is formed of a single plate. The oscillatory wave motor of FIG. 3A includes an oscillator 201, a rotor 202, which is brought into contact with the sliding surface of the oscillator 201 with a pressurizing force applied by a pressure spring (not shown), and an output shaft 203 arranged so as to be integrated with the rotor 202. The oscillator 201 is formed of a metal elastic ring 2011, a piezoelectric element 2012 manufactured by the manufacturing method of the present invention, and an organic adhesive 2013 for bonding the piezoelectric element 2012 to the elastic ring 2011 (such as an epoxy- or cyanoacrylate-based adhesive). The piezoelectric element 2012 manufactured by the manufacturing method of the present invention is formed of a piezoelectric material sandwiched between a first electrode (not shown) and a second electrode (not shown).

The application of two alternating voltages different from each other in phase by an odd multiple of $\pi/2$ to the piezoelectric element manufactured by the manufacturing method of the present invention results in the generation of a flexural traveling wave in the oscillator 201, and hence each point on the sliding surface of the oscillator 201 undergoes an elliptical motion. When the rotor 202 is brought into pressure contact with the sliding surface of the oscillator 201, the rotor 202 receives a frictional force from the oscillator 201 to rotate in the direction opposite to the flexural traveling wave. A body to be driven (not shown) is joined to the output shaft 203, and is driven by the rotary force of the rotor 202.

The application of a voltage to the piezoelectric material results in the expansion and contraction of the piezoelectric material due to a transverse piezoelectric effect. When an elastic body, such as a metal, is joined to the piezoelectric element, the elastic body is bent by the expansion and contraction of the piezoelectric material. The oscillatory wave motor of the kind described in the foregoing utilizes this principle.

Next, an oscillatory wave motor including a multilayered piezoelectric element having a multilayered structure is illustrated in FIG. 3B. An oscillator 204 is formed of a multilayered piezoelectric element 2042 sandwiched between tubular metal elastic bodies 2041. The multilayered piezoelectric element 2042 is an element formed of a plurality of stacked piezoelectric material layers and electrode layers (not shown), and includes a first electrode and a second electrode on the outer surfaces (uppermost layer and lowermost layer) of the multilayered structure, and internal electrodes on the inner surface (between the piezoelectric material layers) of the multilayered structure. The metal elastic bodies 2041 in the upper and lower portions of the multilayered structure are fastened with bolts so that the multilayered piezoelectric element 2042 is sandwiched between and fixed by the bodies. Thus, the oscillator 204 is formed.

The application of alternating voltages different from each other in phase to the multilayered piezoelectric element 2042 causes the oscillator 204 to excite two vibrations orthogonal to each other. The two vibrations are combined to form a circular vibration for driving the tip portion of the oscillator 204 (upper ends of the metal elastic bodies 2041). A constricted annular groove is formed in the upper portion of the oscillator 204 to enlarge the displacement of the vibration for driving.

A rotor 205 is brought into pressure contact with the oscillator 204 by a spring 206 for pressurization to obtain a frictional force for driving. The rotor 205 is rotatably supported by a bearing.

(Optical Apparatus)

A method of manufacturing an optical apparatus of the present invention includes dynamically connecting an optical member to a moving member of an oscillatory wave motor manufactured by the manufacturing method of the present invention.

Dynamically connecting the optical member to the moving member means achieving a state in which an optical member, for example, a lens can be moved through use of a frictional force with the movement of the moving member (rotor) as a drive force.

Figure 4A:
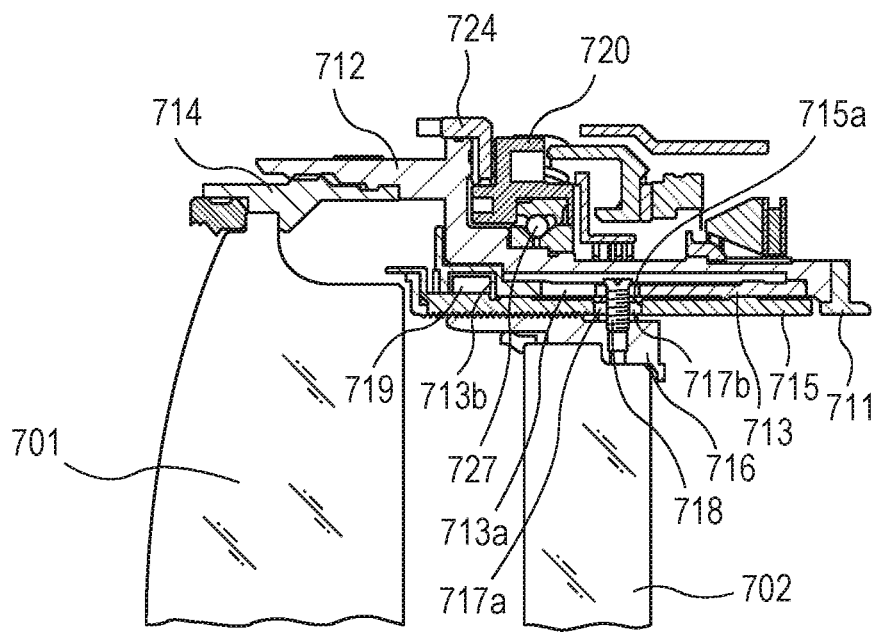
FIG. 4A is a schematic sectional view for schematically illustrating an example of an optical apparatus manufactured by a manufacturing method of the present invention.
Figure 4B:
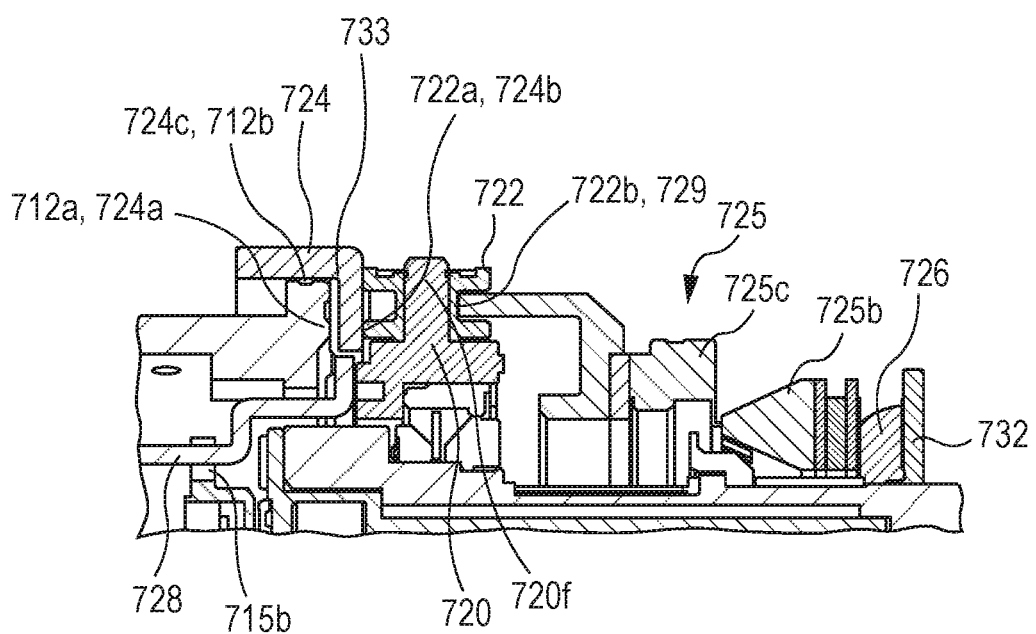
FIG. 4B is a view for illustrating a part of the optical apparatus of FIG. 4A in more detail.
Figure 5:
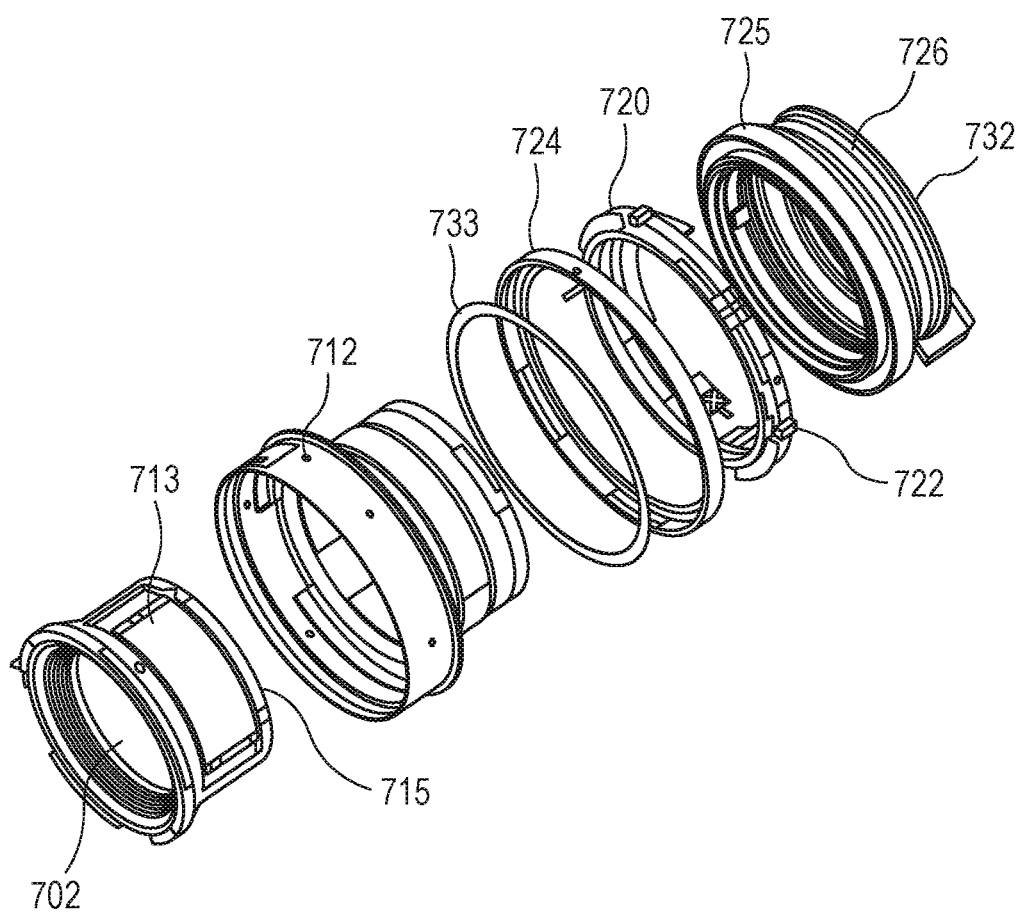
FIG. 5 is a schematic exploded perspective view for schematically illustrating an example of the optical apparatus manufactured by the manufacturing method of the present invention.

FIG. 4A and FIG. 4B are each a schematic sectional view for schematically illustrating main parts of an interchangeable lens barrel for a single-lens reflex camera as a preferred example of the optical apparatus manufactured by the method of manufacturing an optical apparatus of the present invention. Further, FIG. 5 is a schematic exploded perspective view for schematically illustrating a configuration of the interchangeable lens barrel for the single-lens reflex camera as the preferred example of the optical apparatus manufactured by the method of manufacturing an optical apparatus of the present invention. A fixed barrel 712, a linear guide barrel 713, and a front unit barrel 714 are fixed to an attaching/detaching mount 711 for a camera, and a front lens unit 701 is held by the front unit barrel 714. Those members are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 holding the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is arranged a rotation transmission ring 720 held by a ball race 727 in a rotatable manner at a constant position with respect to the fixed barrel 712. The rotation transmission ring 720 has shafts 720f extending radially from the rotation transmission ring 720, and rollers 722 are held by the shafts 720f in a rotatable manner. A large diameter part 722a of the roller 722 is brought into contact with a mount side end surface 724b of a manual focus ring 724. In addition, a small diameter part 722b of the roller 722 is brought into contact with a joining member 729. Six rollers 722 are arranged on the outer periphery of the rotation transmission ring 720 at regular intervals, and each roller is arranged in the relationship as described above.

A low friction sheet (washer member) 733 is arranged on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

The large diameter part 722a of the roller 722 is brought into contact with the mount side end surface 724b of the manual focus ring under a state in which a pressurizing force is applied by a pressing force of a waved washer 726 pressing an oscillatory wave motor 725 to the front of the lens. In addition, similarly, the small diameter part 722b of the roller 722 is brought into contact with the joining member 729 under a state in which an appropriate pressurizing force is applied by a pressing force of the waved washer 726 pressing the oscillatory wave motor 725 to the front of the lens. Movement of the waved washer 726 in the mount direction is restricted by a washer 732 connected to the fixed barrel 712 by bayonet joint. A spring force (biasing force) generated by the waved washer 726 is transmitted to the oscillatory wave motor 725, and further to the roller 722, to be a force for the manual focus ring 724 to press the mount side end surface 712a of the fixed barrel 712. In other words, the manual focus ring 724 is integrated under a state in which the manual focus ring 724 is pressed to the mount side end surface 712a of the fixed barrel 712 via the low friction sheet 733.

Therefore, when a control unit (not shown) drives the oscillatory wave motor 725 to rotate with respect to the fixed barrel 712, the rollers 722 rotate about the shafts 720f because the joining member 729 is brought into frictional contact with the small diameter parts 722b of the rollers 722. As a result of the rotation of the rollers 722 about the shafts 720f, the rotation transmission ring 720 rotates about the optical axis (automatic focus operation). In addition, when a manual operation input portion (not shown) gives a rotation force about the optical axis to the manual focus ring 724, the following action occurs.

That is, the rollers 722 rotate about the shafts 720f by a frictional force because the mount side end surface 724b of the manual focus ring 724 is brought into pressure contact with the large diameter parts 722a of the rollers 722. When the large diameter parts 722a of the rollers 722 rotate about the shafts 720f, the rotation transmission ring 720 rotates about the optical axis. In this case, the oscillatory wave motor 725 does not rotate because of a friction retaining force between a rotor 725c and a stator 725b (manual focus operation).

Two focus keys 728 are mounted to the rotation transmission ring 720 at opposing positions, and the focus key 728 is fitted to a notch portion 715b arranged on the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

While the interchangeable lens barrel for the single-lens reflex camera has been described as the optical apparatus manufactured by the manufacturing method of the present invention, the manufacturing method of the present invention can be applied to a method of manufacturing an optical apparatus including the drive unit including the oscillatory wave motor, regardless of a type of the camera, including a compact camera, an electronic still camera, and the like.

(Electronic Apparatus)

A method of manufacturing an electronic apparatus of the present invention is a method of manufacturing an electronic apparatus including a piezoelectric element in a member, and the method includes arranging a piezoelectric element manufactured by the method of manufacturing a piezoelectric element of the present invention in a member.

That is, the electronic apparatus manufactured by the manufacturing method of the present invention includes a piezoelectric acoustic component including the piezoelectric element manufactured by the method of manufacturing a piezoelectric element of the present invention. The piezoelectric acoustic component encompasses a speaker, a buzzer, a microphone, and a surface acoustic wave (SAW) element.

Figure 6:
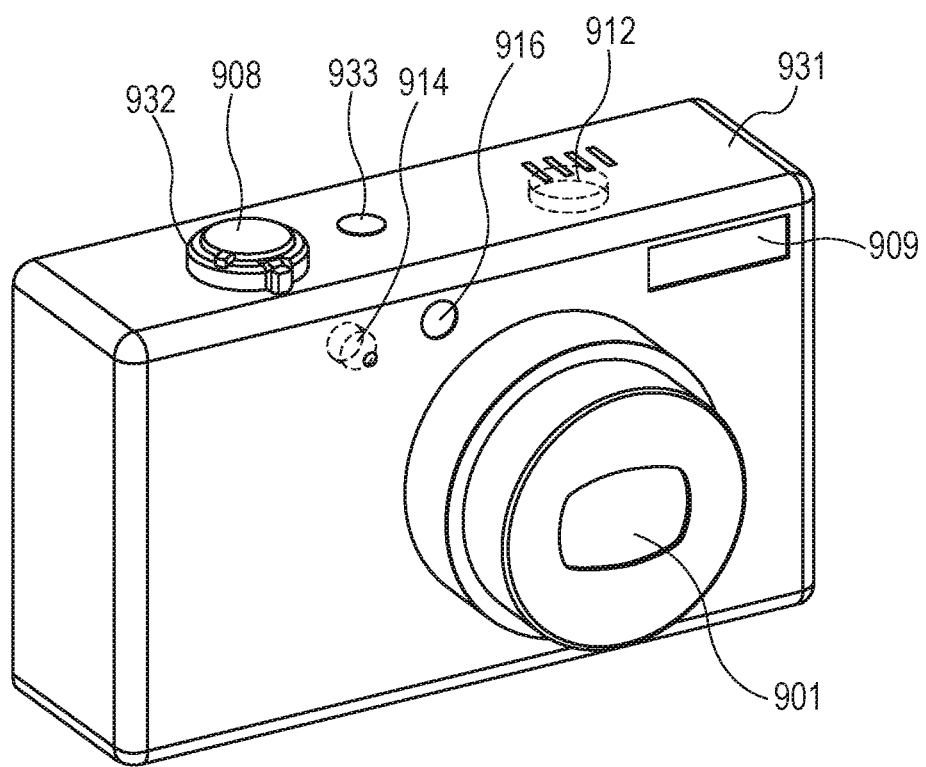
FIG. 6 is a schematic perspective view for schematically illustrating an example of an electronic apparatus manufactured by a manufacturing method of the present invention.

FIG. 6 is a general perspective view for schematically illustrating the appearance of a digital camera as a preferred example of the electronic apparatus manufactured by the manufacturing method of the present invention when viewed from the front of a main body 931 thereof. An optical apparatus 901, a microphone 914, a stroboscopic light emission unit 909, and a fill light emission unit 916 are arranged on a front surface of the main body 931. The microphone 914 is installed in the main body, and hence is illustrated by a broken line. In the front of the microphone 914, there is a hole arranged for collecting external sound.

A power button 933, a speaker 912, a zoom lever 932, and a release button 908 for performing a focus operation are arranged on the top surface of the main body 931. The speaker 912 is installed in the main body 931, and hence is illustrated by a broken line. In the front of the speaker 912, there is a hole arranged for transmitting sound to the outside.

The piezoelectric element manufactured by the manufacturing method of the present invention is used for at least one of the microphone 914, the speaker 912, or the surface acoustic wave element.

While the digital camera has been described as the electronic apparatus manufactured by the manufacturing method of the present invention, the electronic apparatus manufactured by the manufacturing method of the present invention can also be applied to a method of manufacturing an electronic apparatus including various types of piezoelectric acoustic components, such as a sound reproduction apparatus, a sound recording apparatus, a cellular phone, or an information terminal.

As described above, the piezoelectric element manufactured by the method of manufacturing a piezoelectric element of the present invention is preferably used in methods of manufacturing an oscillatory wave motor, an optical apparatus, and an electronic apparatus.

The method of manufacturing a piezoelectric element of the present invention is hereinafter described specifically by way of Examples. However, the present invention is not limited to the following Examples.

A piezoelectric element was manufactured in each of Examples of the method of manufacturing a piezoelectric element of the present invention in which electrodes were short-circuited at a time of the heat treatment and Comparative Examples in which electrodes were not short-circuited at a time of the heat treatment through use of, as piezoelectric materials, lead zirconate titanate (PZT), a solid solution of sodium niobate and a small amount of barium titanate (NN-BT), and barium titanate doped with Ca, Zr, and Mn (BCTZ-Mn). As piezoelectric properties of the piezoelectric materials used for manufacturing, a Curie temperature Tc and a piezoelectric constant $d_{31}$ at room temperature (25° C.) were evaluated. A dielectric constant was measured while a measurement temperature was changed through use of a small AC electric field having a frequency of 1 kHz, and the Curie temperature Tc was determined from a temperature at which the dielectric constant exhibited a local maximum. Further, the piezoelectric constants $d_{31}$ were measured by the resonant-antiresonant method before and after the heat treatment, and an absolute value $d_{before}$ of the piezoelectric constant $d_{31}$ before the heat treatment and an absolute value $d_{after}$ of the piezoelectric constant $d_{31}$ after the heat treatment were determined. Then, each manufacturing method was evaluated through use of a ratio $d_{before}/d_{after} \times 100$ (referred to as "piezoelectric constant retention ratio before and after the heat treatment" (%)) of the absolute value $d_{after}$ with respect to the absolute value $d_{before}$. A manufacturing condition and evaluation results in each of Examples and Comparative Examples are shown in Table 1 and Table 2.

(Manufacturing of Piezoelectric Element)

Example 1

Figure 7A:
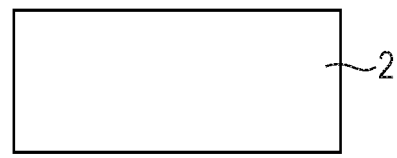
FIG. 7A is a schematic step view for illustrating an exemplary step of a method of manufacturing a piezoelectric element of the present invention.
Figure 7B:
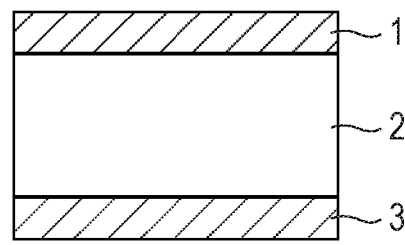
FIG. 7B is a schematic step view for illustrating an exemplary step of a method of manufacturing a piezoelectric element of the present invention.
Figure 7C:
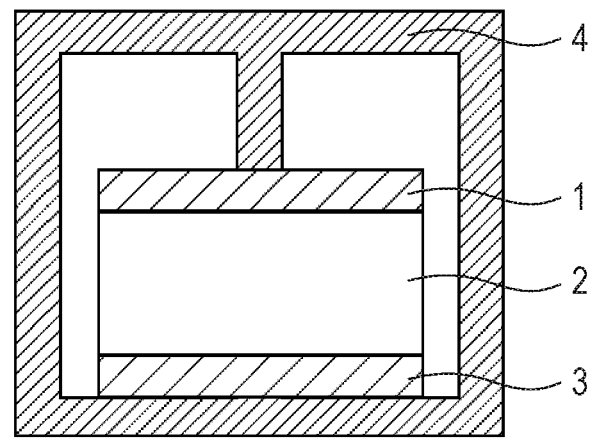
FIG. 7C is a schematic step view for illustrating an exemplary step of a method of manufacturing a piezoelectric element of the present invention.
Figure 7D:
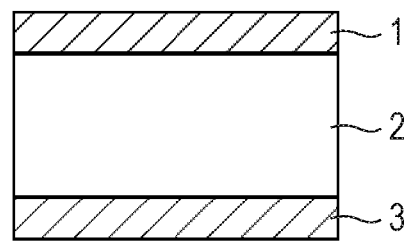
FIG. 7D is a schematic step view for illustrating an exemplary step of a method of manufacturing a piezoelectric element of the present invention.

Operation procedures in this Example and in each of the following Examples are schematically illustrated in FIG. 7A to FIG. 7D. Commercially available lead zirconate titanate (PZT) was used as a piezoelectric material 2 illustrated in FIG. 7A, and two upper and lower electrodes 1 and 3 were formed on the piezoelectric material 2 through use of a silver paste as illustrated in FIG. 7B. Next, as illustrated in FIG. 7C, the two electrodes 1 and 3 were short-circuited through use of a tool 4 formed of a conductive metal portion and a metal plate, followed by heat treatment in this state, to thereby manufacture a piezoelectric element. The heat treatment was performed under a state in which the tool 4 was placed on a hot plate. A maximum reaching temperature of a surface of the upper electrode 1 formed on the piezoelectric material 2 at a time of the heat treatment was 315° C., and the temperature was kept at 315° C. for 1 minute. After the heat treatment, the tool 4 was removed from the hot plate while the piezoelectric element was placed on the tool 4, and the piezoelectric element was naturally cooled on the metal plate. The tool 4 was removed as illustrated in FIG. 7D at a time when the temperature of the surface of the upper electrode 1 reached 35° C., to thereby electrically open the short circuit of the two electrodes 1 and 3.

Example 2

A piezoelectric element was manufactured in the same manner as in Example 1 except that the maximum reaching temperature of the surface of the upper electrode 1 at a time of the heat treatment was set to 325° C.

Example 3

A piezoelectric element was manufactured in the same manner as in Example 2 except that the temperature of the surface of the upper electrode 1 was set to 155° C. at a time when the short circuit of the electrodes 1 and 3 was electrically opened.

Example 4

A piezoelectric element was manufactured in the same manner as in Example 2 except that the temperature of the surface of the upper electrode 1 was set to 250° C. at a time when the short circuit of the electrodes 1 and 3 was electrically opened.

Example 5

Barium titanate doped with Ca, Zr, and Mn (BCTZ-Mn) was used as the piezoelectric material 2 illustrated in FIG. 7A, and the two upper and lower electrodes 1 and 3 were formed on the piezoelectric material 2 through use of a silver paste as illustrated in FIG. 7B. Next, as illustrated in FIG. 7C, the two electrodes 1 and 3 were short-circuited through use of the tool 4, followed by heat treatment in this state, to thereby manufacture a piezoelectric element. The heat treatment was performed under a state in which the tool 4 was placed on a hot plate. A maximum reaching temperature of a surface of the upper electrode 1 formed on the piezoelectric material 2 at a time of the heat treatment was 115° C., and the temperature was kept at 115° C. for 1 minute. After the heat treatment, the tool 4 was removed from the hot plate while the piezoelectric element was placed on the tool 4, and the piezoelectric element was naturally cooled on the metal plate. The tool 4 was removed as illustrated in FIG. 7D at a time when the temperature of the surface of the upper electrode 1 reached 35° C., to thereby electrically open the short circuit of the two electrodes 1 and 3. The content of an impurity element in the piezoelectric material 2 was measured by semi-quantitative analysis using glow-discharge mass spectrometry (GDMS), and as a result, the content of Pb in the piezoelectric material 2 was less than 50 ppm.

Example 6

A piezoelectric element was manufactured in the same manner as in Example 5 except that the maximum reaching temperature of the surface of the upper electrode 1 at a time of the heat treatment was set to 128° C.

Example 7

A piezoelectric element was manufactured in the same manner as in Example 5 except that the maximum reaching temperature of the surface of the upper electrode 1 at a time of the heat treatment was set to 140° C.

Example 8

A piezoelectric element was manufactured in the same manner as in Example 7 except that the temperature of the surface of the upper electrode 1 was set to 103° C. at a time when the short circuit of the electrodes 1 and 3 was electrically opened.

Example 9

A piezoelectric element was manufactured in the same manner as in Example 7 except that the temperature of the surface of the upper electrode 1 was set to 89° C. at a time when the short circuit of the electrodes 1 and 3 was electrically opened.

Example 10

A piezoelectric element was manufactured in the same manner as in Example 7 except that the temperature of the surface of the upper electrode 1 was set to 75° C. at a time when the short circuit of the electrodes 1 and 3 was electrically opened.

Example 11

A piezoelectric element was manufactured in the same manner as in Example 7 except that the temperature of the surface of the upper electrode 1 was set to 63° C. at a time when the short circuit of the electrodes 1 and 3 was electrically opened.

Example 12

A piezoelectric element was manufactured in the same manner as in Example 7 except that the temperature of the surface of the upper electrode 1 was set to 55° C. at a time when the short circuit of the electrodes 1 and 3 was electrically opened.

Comparative Example 1

A piezoelectric element was manufactured in the same manner as in Example 1 except that the heat treatment was performed while the two electrodes 1 and 3 formed on the piezoelectric material 2 were left opened.

Comparative Example 2

A piezoelectric element was manufactured in the same manner as in Example 2 except that the heat treatment was performed while the two electrodes 1 and 3 formed on the piezoelectric material 2 were left opened.

Comparative Example 3

A piezoelectric element was manufactured in the same manner as in Example 5 except that the heat treatment was performed while the two electrodes 1 and 3 formed on the piezoelectric material 2 were left opened.

Comparative Example 4

A piezoelectric element was manufactured in the same manner as in Example 7 except that the heat treatment was performed while the two electrodes 1 and 3 formed on the piezoelectric material 2 were left opened.

Further, relationships between the maximum reaching temperature of the surface of the piezoelectric material (surface of the electrode) and the piezoelectric constant retention ratio before and after the heat treatment, and relationships between the temperature for opening the short circuit between the electrodes (temperature at a time when the short circuit between the electrodes is opened) and the piezoelectric constant retention ratio before and after the heat treatment in Examples 1 to 12 and Comparative Examples 1 to 4 are shown in FIG. 10A to FIG. 10D.

TABLE 1

| | Piezoelectric material | Tc (° C.) | Tc/2 (° C.) | State between electrodes at time of heat treatment | Maximum reaching temperature of piezoelectric material (° C.) | Temperature for opening short circuit of piezoelectric material (° C.) | Piezoelectric constant before heat treatment $d_{before}|d_{31}|$ (pm/V) | Piezoelectric constant after heat treatment $d_{after}|d_{31}|$ (pm/V) | Piezoelectric constant retention ratio before and after heat treatment (%) |
|---|---|---|---|---|---|---|---|---|---|
| Example 1 | PZT | 310 | 155 | Short circuit | 315 | 35 | 128 | 125 | 98 |
| Example 2 | PZT | 310 | 155 | Short circuit | 325 | 35 | 128 | 110 | 86 |
| Example 3 | PZT | 310 | 155 | Short circuit | 325 | 155 | 128 | 105 | 82 |
| Example 4 | PZT | 310 | 155 | Short circuit | 325 | 250 | 127 | 78 | 61 |
| Example 5 | BCTZ-Mn | 110 | 55 | Short circuit | 115 | 35 | 102 | 101 | 99 |
| Example 6 | BCTZ-Mn | 110 | 55 | Short circuit | 128 | 35 | 103 | 102 | 99 |
| Example 7 | BCTZ-Mn | 110 | 55 | Short circuit | 140 | 35 | 103 | 98 | 95 |
| Example 8 | BCTZ-Mn | 110 | 55 | Short circuit | 140 | 103 | 102 | 55 | 54 |
| Example 9 | BCTZ-Mn | 110 | 55 | Short circuit | 140 | 89 | 102 | 66 | 65 |
| Example 10 | BCTZ-Mn | 110 | 55 | Short circuit | 140 | 75 | 101 | 75 | 74 |
| Example 11 | BCTZ-Mn | 110 | 55 | Short circuit | 140 | 63 | 103 | 81 | 79 |
| Example 12 | BCTZ-Mn | 110 | 55 | Short circuit | 140 | 55 | 102 | 89 | 87 |
| Comparative Example 1 | PZT | 310 | 155 | Opening | 315 | — | 128 | 54 | 42 |
| Comparative Example 2 | PZT | 310 | 155 | Opening | 325 | — | 128 | 43 | 34 |
| Comparative Example 3 | BCTZ-Mn | 110 | 55 | Opening | 115 | — | 102 | 44 | 43 |
| Comparative Example 4 | BCTZ-Mn | 110 | 55 | Opening | 140 | — | 102 | 23 | 23 |

(Note)
The materials represent the following compounds.
PZT = Pb(Zr, Ti)O$_3$
BCTZ-Mn = (Ba$_{0.84}$Ca$_{0.16}$)(Ti$_{0.94}$Zr$_{0.06}$)O$_3$ (100 parts by weight) + Mn (0.26 part by weight)

Evaluation of Manufacturing Method in Each of Examples 1 to 12 and Comparative Examples 1 to 4

Comparison Between Example 1 and Comparative Example 1

In each of Example 1 and Comparative Example 1, the maximum reaching temperature of 315° C. of the piezoelectric material was higher than the Curie temperature of 310° C. of PZT. However, in Example 1, the electrodes were short-circuited at a time of the heat treatment, and hence the piezoelectric constant retention ratio before and after the heat treatment was 98% that was significantly larger than 80%. Thus, a satisfactory result was obtained. Meanwhile, in Comparative Example 1, the electrodes were opened at a time of the heat treatment, and hence the piezoelectric constant retention ratio before and after the heat treatment was 42%, and thus the piezoelectric constant decreased to less than 50% of that before the heat treatment.

Comparison Between Example 2 and Comparative Example 2

In Example 2, the maximum reaching temperature of 325° C. of the piezoelectric material was higher than the Curie temperature of 310° C. of PZT by 15° C. However, in Example 2, the electrodes were short-circuited at a time of the heat treatment, and hence the piezoelectric constant retention ratio before and after the heat treatment was 86% that was sufficiently larger than 80%. Thus, a satisfactory result was obtained. Meanwhile, in Comparative Example 2, the electrodes were opened at a time of the heat treatment, and hence the piezoelectric constant retention ratio before and after the heat treatment was 34%, and thus the piezoelectric constant significantly decreased to less than 50% of that before the heat treatment.

Comparison Between Example 1 and Example 2

In Example 2, the maximum reaching temperature of 325° C. of the piezoelectric material was higher than that in the manufacturing method of Example 1 (315° C.). However, in Example 2, the electrodes were short-circuited at a time of the heat treatment, and hence the piezoelectric constant retention ratio before and after the heat treatment was 86%, which was inferior to 98% in Example 1 but maintained a value of 80% or more.

Comparison of Example 2 to Example 4

In each of Example 2 to Example 4, the maximum reaching temperature of 325° C. of the piezoelectric material was higher than the Curie temperature of 310° C. of PZT by 15° C. However, in those Examples, the electrodes were short-circuited at a time of the heat treatment, and hence the piezoelectric constant retention ratios before and after the heat treatment were 86%, 82%, and 61%, respectively, i.e., all the retention ratios were 50% or more. Further, the piezoelectric constant retention ratio before and after the heat treatment was changed depending on the temperature for opening the short circuit of the electrodes. In particular, when the short circuit of the electrodes was electrically opened at a time when the temperature of the piezoelectric material decreased to (Tc/2) or less, the piezoelectric constant retention ratio before and after the heat treatment reached 80% or more. Thus, a decrease in piezoelectric constant of the piezoelectric material was suppressed, and the piezoelectric properties were able to be sufficiently exhibited.

Comparison Between Example 5 and Comparative Example 3

In each of Example 5 and Comparative Example 3, the maximum reaching temperature of 115° C. of the piezoelectric material was higher than the Curie temperature of 110° C. of BCTZ-Mn by 5° C. However, in Example 5, the electrodes were short-circuited at a time of the heat treatment, and hence the piezoelectric constant retention ratio before and after the heat treatment was 99% that was significantly larger than 80%. Thus, a satisfactory result was obtained. Meanwhile, in Comparative Example 3, the electrodes were opened at a time of the heat treatment, and hence the piezoelectric constant retention ratio before and after the heat treatment was 43%, and thus the piezoelectric constant decreased to less than 50% of that before the heat treatment.

Comparison of Example 5 to Example 7

In the manufacturing methods of Example 5 to Example 7, the maximum reaching temperatures of the piezoelectric materials were 115° C., 128° C., and 140° C. that were higher than the Curie temperature of 110° C. of BCTZ-Mn. However, in those Examples, the electrodes were short-circuited at a time of the heat treatment, and hence piezoelectric constant retention ratios before and after the heat treatment were 99%, 99%, and 95%, respectively, i.e., all the retention ratios were significantly larger than 80%. Thus, satisfactory results were obtained.

Comparison Between Example 7 and Comparative Example 4

In each of Example 7 and Comparative Example 4, the maximum reaching temperature of 140° C. of the piezoelectric material was higher than the Curie temperature of 110° C. of BCTZ-Mn by as high as 30° C. However, in Example 7, the electrodes were short-circuited at a time of the heat treatment, and hence the piezoelectric constant retention ratio before and after the heat treatment was 95% that was larger than 80%. Thus, a satisfactory result was obtained. Meanwhile, in Comparative Example 4, the electrodes were opened at a time of the heat treatment, and hence the piezoelectric constant retention ratio before and after the heat treatment was 23%, and thus the piezoelectric constant significantly decreased to less than 50% of that before the heat treatment.

Comparison of Example 7 to Example 12

In each of the manufacturing methods of Example 7 to Example 12, the maximum reaching temperature of 140° C. of the piezoelectric material was higher than the Curie temperature of 110° C. of BCTZ-Mn by 30° C. However, in those Examples, the electrodes were short-circuited at a time of the heat treatment, and hence the piezoelectric constant retention ratios before and after the heat treatment were 95%, 54%, 65%, 74%, 79%, and 87%, respectively, i.e., all the retention ratios were 50% or more. Further, the piezoelectric constant retention ratio before and after the heat treatment was changed depending on the temperature for opening the short circuit of the electrodes. In particular, when the short circuit of the electrodes was electrically opened at a time when the temperature of the piezoelectric material decreased to (Tc/2) or less, the piezoelectric constant retention ratio before and after the heat treatment reached 80% or more. Thus, a decrease in piezoelectric constant of the piezoelectric material was suppressed, and the piezoelectric properties were able to be sufficiently exhibited.

Example 14

A solid solution of sodium niobate and a small amount of barium titanate (NN-BT) was used as the piezoelectric material 2 illustrated in FIG. 7A, and the two upper and lower electrodes 1 and 3 were formed on the piezoelectric material 2 through use of a silver paste as illustrated in FIG. 7B. Next, as illustrated in FIG. 7C, the two electrodes 1 and 3 were short-circuited through use of the tool 4, followed by heat treatment in this state, to thereby manufacture a piezoelectric element. The heat treatment was performed under a state in which the tool 4 was placed on a hot plate. A maximum reaching temperature of a surface of the upper electrode 1 formed on the piezoelectric material 2 at a time of the heat treatment was 195° C., and the temperature was kept at 195° C. for 1 minute. After the heat treatment, the tool 4 was removed from the hot plate while the piezoelectric element was placed on the tool 4, and the piezoelectric element was naturally cooled on the metal plate. The tool 4 was removed as illustrated in FIG. 7D at a time when the temperature of the surface of the upper electrode 1 reached 35° C., to thereby electrically open the short circuit of the two electrodes 1 and 3. The content of an impurity element in the piezoelectric material 2 was measured by semi-quantitative analysis using glow-discharge mass spectrometry (GDMS), and as a result, the content of Pb in the piezoelectric material 2 was less than 50 ppm.

Example 15

A piezoelectric element was manufactured in the same manner as in Example 14 except that the maximum reaching temperature of the surface of the upper electrode 1 at a time of the heat treatment was set to 200° C.

Example 16

A piezoelectric element was manufactured in the same manner as in Example 15 except that the temperature of the surface of the upper electrode 1 was set to 95° C. at a time when the short circuit of the electrodes 1 and 3 was electrically opened.

Example 17

A piezoelectric element was manufactured in the same manner as in Example 15 except that the temperature of the surface of the upper electrode 1 was set to 110° C. at a time when the short circuit of the electrodes 1 and 3 was electrically opened.

Comparative Example 6

A piezoelectric element was manufactured in the same manner as in Example 14 except that the heat treatment was performed while the two electrodes 1 and 3 formed on the piezoelectric material 2 were left opened.

Comparative Example 7

A piezoelectric element was manufactured in the same manner as in Example 15 except that the heat treatment was performed while the two electrodes 1 and 3 formed on the piezoelectric material 2 were left opened.

Figure 11A:
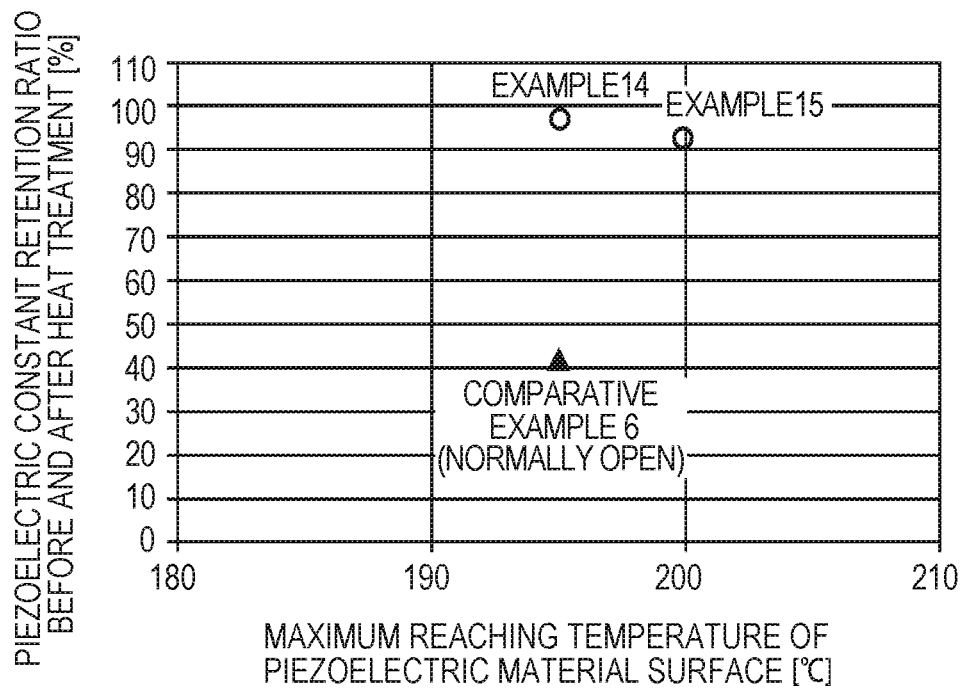
FIG. 11A is a graph for showing a relationship between a heat treatment condition and a piezoelectric constant retention ratio before and after heat treatment regarding piezoelectric elements manufactured by manufacturing methods according to Examples and Comparative Examples of the present invention.
Figure 11B:
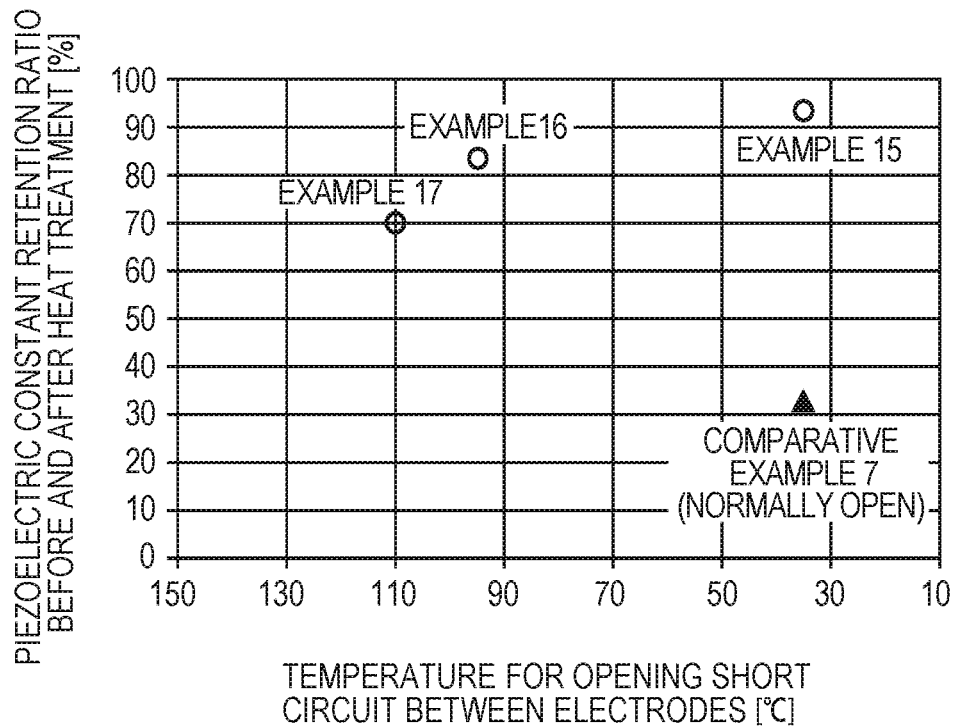
FIG. 11B is a graph for showing a relationship between a heat treatment condition and a piezoelectric constant retention ratio before and after heat treatment regarding piezoelectric elements manufactured by manufacturing methods according to Examples and Comparative Examples of the present invention.

Further, relationships between the maximum reaching temperature of the surface of the piezoelectric material (surface of the electrode) and the piezoelectric constant retention ratio before and after the heat treatment, and relationships between the temperature for opening the short circuit between the electrodes (temperature at a time when the short circuit between the electrodes is opened) and the piezoelectric constant retention ratio before and after the heat treatment in Examples 14 to 17 and Comparative Examples 6 and 7 are shown in FIG. 11A and FIG. 11B.

TABLE 2

|  | Piezoelectric material | Tc (° C.) | Tc/2 (° C.) | State between electrodes | Maximum reaching temperature of piezoelectric material (° C.) | Temperature for opening short circuit of piezoelectric material (° C.) | Piezoelectric constant before heat treatment $d_{before}|d_{31}|$ (pm/V) | Piezoelectric constant after heat treatment $d_{after}|d_{31}|$ (pm/V) | Piezoelectric constant retention ratio before and after heat treatment (%) |
|---|---|---|---|---|---|---|---|---|---|
| Example 14 | NN-BT | 190 | 95 | Short circuit | 195 | 35 | 43 | 42 | 98 |
| Example 15 | NN-BT | 190 | 95 | Short circuit | 200 | 35 | 43 | 40 | 93 |
| Example 16 | NN-BT | 190 | 95 | Short circuit | 200 | 95 | 42 | 35 | 83 |
| Example 17 | NN-BT | 190 | 95 | Short circuit | 200 | 110 | 43 | 30 | 70 |
| Comparative Example 6 | NN-BT | 190 | 95 | Opening | 195 | — | 43 | 18 | 42 |
| Comparative Example 7 | NN-BT | 190 | 95 | Opening | 200 | — | 44 | 14 | 32 |

(Note)
The material represents the following compound.
NN-BT = 0.88NaNbO$_3$ + 0.12BaTiO$_3$ Evaluation of Manufacturing Method in Each of Examples 14 to 17 and Comparative Examples 6 and 7

Comparison Between Example 14 and Comparative Example 6

In each of Example 14 and Comparative Example 6, the maximum reaching temperature of 195° C. of the piezoelectric material was higher than the Curie temperature of 190° C. of NN-BT. However, in Example 14, the electrodes were short-circuited at a time of the heat treatment, and hence the piezoelectric constant retention ratio before and after heat treatment was 98% that was significantly larger than 80%. Thus, a satisfactory result was obtained. Meanwhile, in Comparative Example 6, the electrodes were opened at a time of the heat treatment, and hence the piezoelectric constant retention ratio before and after the heat treatment was 42%, and thus the piezoelectric constant decreased to less than 50% of that before the heat treatment.

Comparison Between Example 15 and Comparative Example 7

In Example 15, the maximum reaching temperature of 200° C. of the piezoelectric material was higher than the Curie temperature of 190° C. of NN-BT by 10° C. However, in Example 15, the electrodes were short-circuited at a time of the heat treatment, and hence the piezoelectric constant retention ratio before and after the heat treatment was 93% that was sufficiently larger than 80%. Thus, a satisfactory result was obtained. Meanwhile, in Comparative Example 7, the piezoelectric constant retention ratio before and after the heat treatment was 32%, and thus the piezoelectric constant significantly decreased to less than 50% of that before the heat treatment.

Comparison Between Example 14 and Example 15

In Example 15, the maximum reaching temperature of 200° C. of the piezoelectric material was higher than that in the manufacturing method of Example 14 (195° C.). However, in Example 15, the electrodes were short-circuited at a time of the heat treatment, and hence the piezoelectric constant retention ratio before and after the heat treatment was 93%, which was inferior to 98% in Example 14 but maintained a value of 80% or more.

Comparison of Example 15 to Example 17

In each of Example 15 to Example 17, the maximum reaching temperature of 200° C. of the piezoelectric material was higher than the Curie temperature of 190° C. of NN-BT by 10° C. However, in those Examples, the electrodes were short-circuited at a time of the heat treatment, and hence the piezoelectric constant retention ratios before and after the heat treatment were 93%, 83%, and 70%, respectively, i.e., all the retention ratios were 50% or more. Further, the piezoelectric constant retention ratio before and after the heat treatment was changed depending on the temperature for opening the short circuit of the electrodes. In particular, when the short circuit of the electrodes was electrically opened at a time when the temperature of the piezoelectric material decreased to (Tc/2) or less, the piezoelectric constant retention ratio before and after the heat treatment reached 80% or more. Thus, a decrease in piezoelectric constant of the piezoelectric material was suppressed, and the piezoelectric properties were able to be sufficiently exhibited.
(Manufacturing of Oscillatory Wave Motor)

Example 13

Figure 8A:
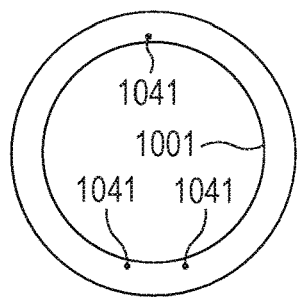
FIG. 8A is a schematic step view for illustrating an exemplary step of a procedure for manufacturing a piezoelectric element with a power supply member by mounting the power supply member on the piezoelectric element by the manufacturing method of the present invention.
Figure 8B:
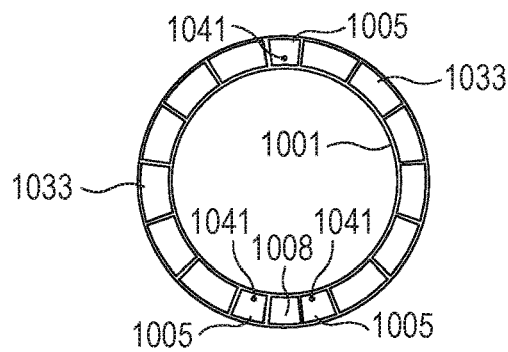
FIG. 8B is a schematic step view for illustrating an exemplary step of a procedure for manufacturing a piezoelectric element with a power supply member by mounting the power supply member on the piezoelectric element by the manufacturing method of the present invention.
Figure 8C:
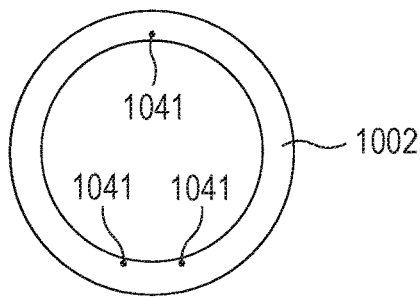
FIG. 8C is a schematic step view for illustrating an exemplary step of a procedure for manufacturing a piezoelectric element with a power supply member by mounting the power supply member on the piezoelectric element by the manufacturing method of the present invention.

A piezoelectric material 1001 having an annular shape illustrated in FIG. 8A was manufactured through use of BCTZ-Mn as a piezoelectric material. A common electrode 1002 was formed on one surface of the piezoelectric material 1001 having an annular shape by screen printing of a silver paste as illustrated in FIG. 8C, and twelve polarizing electrodes 1033, three ground electrodes 1005, and one detection phase electrode 1008 were formed on the other surface thereof by screen printing of a silver paste as illustrated in FIG. 8B. In this case, the distance between the adjacent electrodes out of the respective electrodes illustrated in FIG. 8B was set to 0.5 mm.

Next, polarization treatment was performed in the air through use of a DC power supply between the common electrode 1002, and the polarizing electrodes 1033, the ground electrodes 1005, and the detection phase electrode 1008. The voltage was set so that an electric field of 1.0 kV/mm was applied, and the temperature and voltage application time were set to 100° C. and 60 minutes, respectively. Further, the voltage was applied until the temperature decreased to 40° C.

Next, a conductive material was applied to an inner side of a through hole 1041 formed in each of the ground electrodes 1005, to thereby short-circuit the ground electrodes 1005 and the common electrode 1002.

Figure 8D:
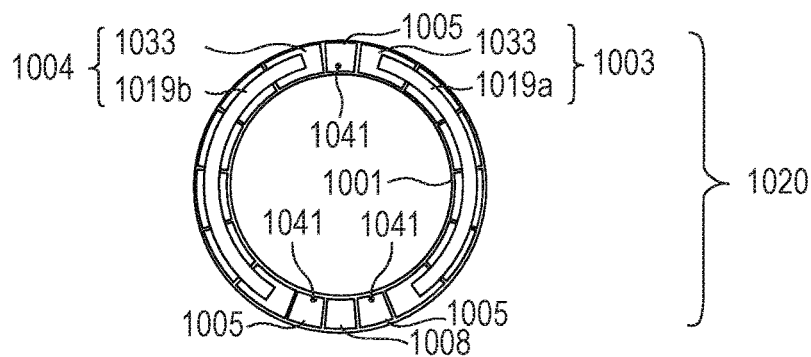
FIG. 8D is a schematic step view for illustrating an exemplary step of a procedure for manufacturing a piezoelectric element with a power supply member by mounting the power supply member on the piezoelectric element by the manufacturing method of the present invention.

Next, as illustrated in FIG. 8D, in order to connect the polarizing electrodes 1033 to each other, connecting electrodes 1019a and 1019b were formed through use of a silver paste to provide a piezoelectric element 1020. The silver paste was dried at a temperature sufficiently lower than the Curie temperature of the piezoelectric material 1001. Here, a resistance value of a drive phase electrode 1003 was measured with a circuit tester (electric tester). One side of the circuit tester was brought into contact with the polarizing electrode 1033 closest to the detection phase electrode 1008, and the other side thereof was brought into contact with the polarizing electrode 1033 farthest from the detection phase electrode 1008 in a circumferential direction of the annular shape of the drive phase electrode 1003. As a result, the resistance value of the drive phase electrode 1003 was 0.6Ω.

Figure 8E:
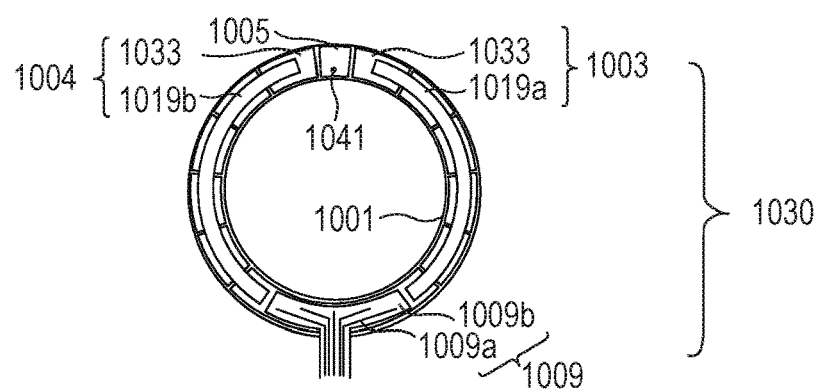
FIG. 8E is a schematic step view for illustrating an exemplary step of a procedure for manufacturing a piezoelectric element with a power supply member by mounting the power supply member on the piezoelectric element by the manufacturing method of the present invention.

Next, as illustrated in FIG. 8E, a flexible printed board 1009 was connected to the piezoelectric element 1020 by thermal compression bonding through use of an anisotropic conductive paste (ACP) to manufacture a piezoelectric element 1030 having a power supply member. At a time of the thermal compression bonding, wiring in a distal end portion of the flexible printed board 1009 was subjected to short circuit treatment through a connector, and the connector was removed after the temperature of a surface of the drive phase electrode 1003 reached 40° C. in a cooling step after the thermal compression bonding, to thereby open the electrodes. Further, the surface of the drive phase electrode 1003 having the power supply member mounted thereon reached 140° C. at a time of the thermal compression bonding.

Figure 9A:
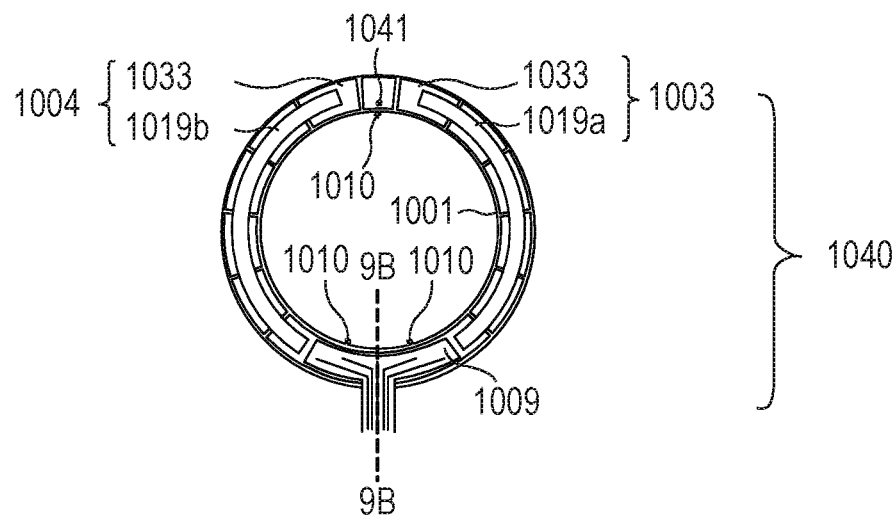
FIG. 9A is a schematic step view for illustrating an exemplary step of a procedure for manufacturing a stator for an oscillatory wave motor by the manufacturing method of the present invention.
Figure 9B:
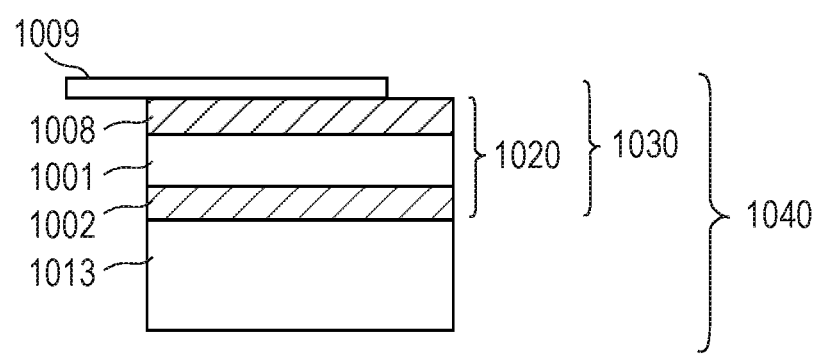
FIG. 9B is a schematic step view for illustrating an exemplary step of a procedure for manufacturing a stator for an oscillatory wave motor by the manufacturing method of the present invention.
Figure 9C:
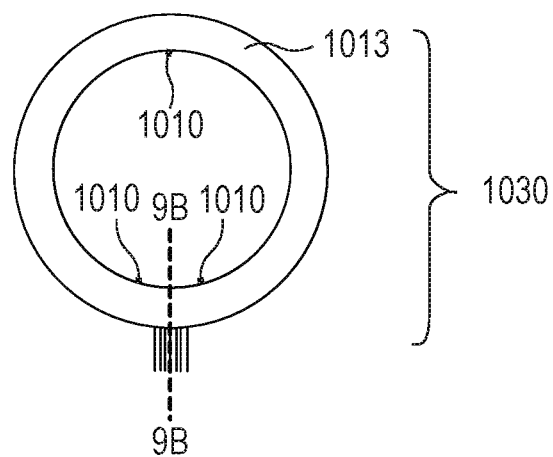
FIG. 9C is a schematic step view for illustrating an exemplary step of a procedure for manufacturing a stator for an oscillatory wave motor by the manufacturing method of the present invention.
Figure 10A:
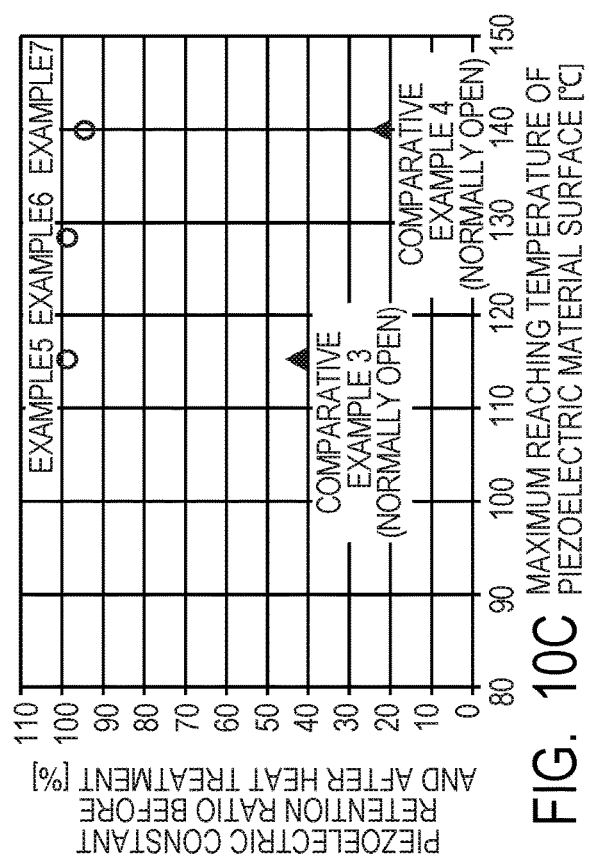
FIG. 10A is a graph for showing a relationship between a heat treatment condition and a piezoelectric constant retention ratio before and after heat treatment regarding piezoelectric elements manufactured by manufacturing methods according to Examples and Comparative Examples of the present invention.
Figure 10B:
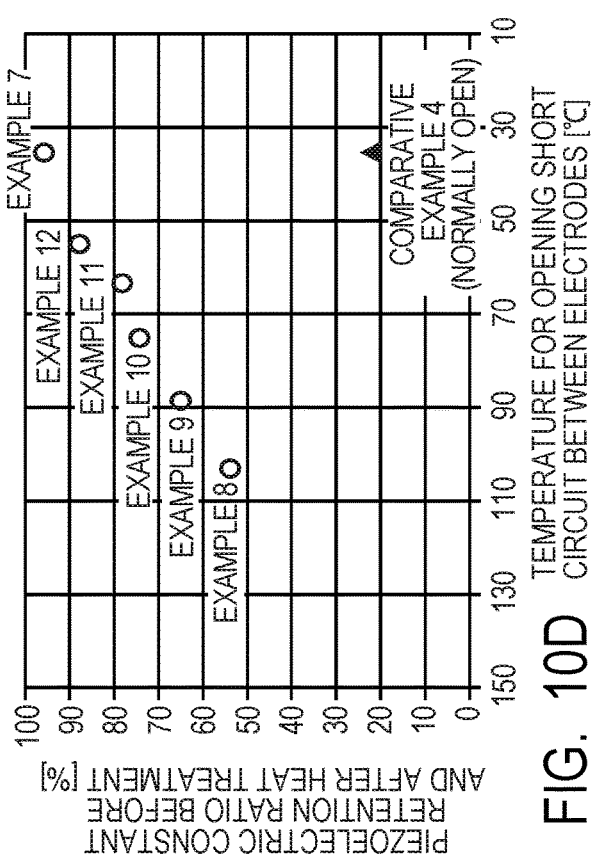
FIG. 10B is a graph for showing a relationship between a heat treatment condition and a piezoelectric constant retention ratio before and after heat treatment regarding piezoelectric elements manufactured by manufacturing methods according to Examples and Comparative Examples of the present invention.
Figure 10C:
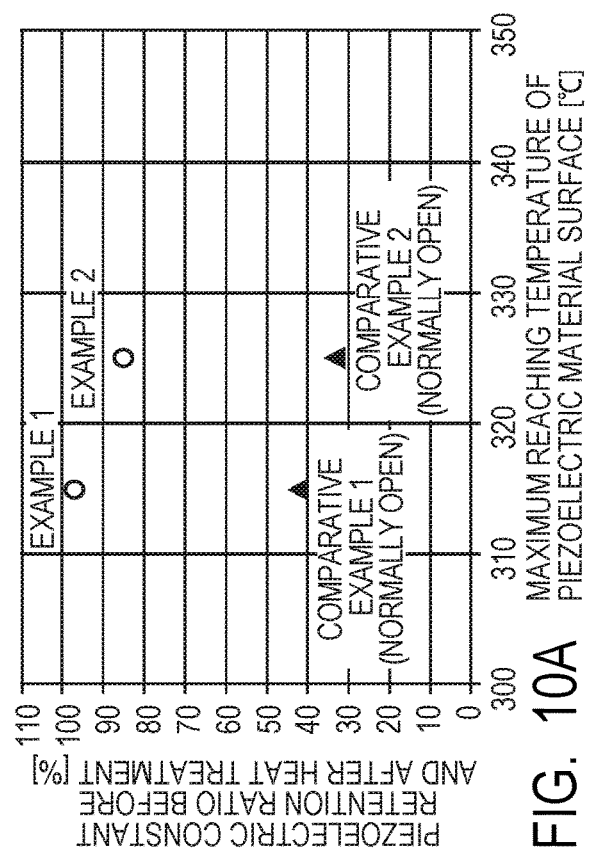
FIG. 10C is a graph for showing a relationship between a heat treatment condition and a piezoelectric constant retention ratio before and after heat treatment regarding piezoelectric elements manufactured by manufacturing methods according to Examples and Comparative Examples of the present invention.
Figure 10D:
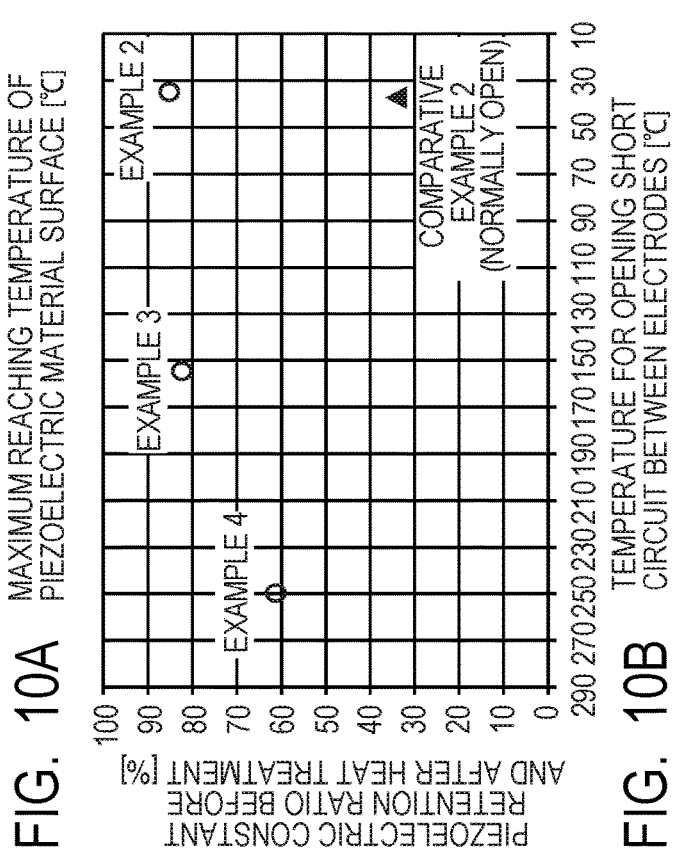
FIG. 10D is a graph for showing a relationship between a heat treatment condition and a piezoelectric constant retention ratio before and after heat treatment regarding piezoelectric elements manufactured by manufacturing methods according to Examples and Comparative Examples of the present invention.

Subsequently, as illustrated in FIG. 9A to FIG. 9C, a vibration plate 1013 made of SUS was connected to the piezoelectric element 1030 having a power supply member manufactured as described above by thermal compression bonding, and the vibration plate 1013 was connected to all the ground electrodes 1005 through short circuit wires 1010 made of a silver paste, to thereby manufacture a stator 1040 for an oscillatory wave motor. The thermal compression bonding of the vibration plate 1013 and the drying of the silver paste were performed at a temperature sufficiently lower than the Curie temperature of the piezoelectric material 1001. FIG. 9A is a schematic plan view of one surface of the stator 1040 for an oscillatory wave motor. FIG. 9B is a sectional view of the stator 1040 for an oscillatory wave motor at a position taken along the line 9B-9B of FIG. 9A. FIG. 9C is a schematic plan view of the other surface of the stator 1040 for an oscillatory wave motor when viewed from an opposite side of FIG. 9A across the piezoelectric element 1020.

A moving member was brought into pressure contact with the stator 1040 for an oscillatory wave motor manufactured as described above, to thereby manufacture an oscillatory wave motor. The rotation number of the oscillatory wave motor in accordance with the application of an alternating voltage to the drive phase electrode 1003 was confirmed. Further, a voltage value in accordance with the rotation number was detected from the detection phase electrode 1008, and the rotation number of the oscillatory wave motor was able to be controlled through use of a voltage value detected from the detection phase electrode 1008.

An oscillatory wave motor manufactured by connecting the flexible printed board to each of the piezoelectric elements manufactured in Examples 1 to 12 and Examples 14 to 17 by thermal compression bonding under the same condition exhibited the same motor rotation behavior.

Comparative Example 5

A piezoelectric element having a power supply element was manufactured in the same manner as in Example 13 except that the flexible printed board was connected to the piezoelectric element by thermal compression bonding under a state in which the ground electrodes 1005 and the common electrode 1002 were opened.

Subsequently, as illustrated in FIG. 9A to FIG. 9C, the vibration plate 1013 made of SUS was connected to the piezoelectric element 1030 having a power supply member manufactured as described above by thermal compression bonding, and the vibration plate 1013 was connected to all the ground electrodes 1005 through the short circuit wires 1010 made of a silver paste, to thereby manufacture the stator 1040 for an oscillatory wave motor. The thermal compression bonding of the vibration plate 1013 and the drying of the silver paste were performed at a temperature sufficiently lower than the Curie temperature of the piezoelectric material 1001. FIG. 9A is a schematic plan view of one surface of the stator 1040 for an oscillatory wave motor. FIG. 9B is a sectional view of the stator 1040 for an oscillatory wave motor at a position taken along the line 9B-9B of FIG. 9A. FIG. 9C is a schematic plan view of the other surface of the stator 1040 for an oscillatory wave motor when viewed from an opposite side of FIG. 9A across the piezoelectric element 1020.

A moving member was brought into pressure contact with the stator 1040 for an oscillatory wave motor manufactured as described above, to thereby manufacture an oscillatory wave motor. The rotation number of the oscillatory wave motor in accordance with the application of an alternating voltage to the drive phase electrode 1003 was smaller than that of the oscillatory wave motor using the method of manufacturing a piezoelectric element in Example 13. Further, a voltage value in accordance with the rotation number could not be detected from the detection phase electrode 1008, and the rotation number of the oscillatory wave motor could not be controlled through use of a voltage value detected from the detection phase electrode 1008.

(Manufacturing of Optical Apparatus)

An optical member was dynamically connected to a moving member of an oscillatory wave motor manufactured in the same manner as in Example 13, to thereby manufacture an optical apparatus illustrated in FIG. 4A. An autofocus operation in accordance with the application of an alternating voltage was confirmed.

(Manufacturing of Electronic Apparatus)

An electronic apparatus illustrated in FIG. 6, in which a piezoelectric element having a power supply member manufactured in the same manner as in Example 13 was arranged as a member, was manufactured. A speaker operation in accordance with the application of an alternating voltage was confirmed.

INDUSTRIAL APPLICABILITY

A significant decrease in piezoelectric constant of a piezoelectric material at a time of heat treatment at a high temperature can be prevented through use of the method of manufacturing a piezoelectric element of the present invention. In particular, even in a heat treatment step at a temperature higher than the Curie temperature of the piezoelectric material, a significant decrease in piezoelectric constant of the piezoelectric material can be prevented. The method of manufacturing a piezoelectric element of the present invention can be used for manufacturing an oscillatory wave motor, an optical apparatus, and an electronic apparatus through use of a piezoelectric element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-040256, filed Mar. 3, 2017, and Japanese Patent Application No. 2018-019435, filed Feb. 6, 2018, which are hereby incorporated by reference herein in their entirety.

The invention claimed is:

1. A method of manufacturing a piezoelectric element, comprising:
a first step of arranging a plurality of electrodes on a piezoelectric material, electrically short-circuiting two or more electrodes of the plurality of electrodes, and subjecting the piezoelectric material to heat treatment; and
a second step of electrically opening the short circuit of the two or more electrodes at a time when a temperature of the piezoelectric material decreases to a temperature at least 7 degrees lower than a Curie temperature Tc of the piezoelectric material.

2. The method according to claim 1, wherein the piezoelectric material forming the piezoelectric element has spontaneous polarization axes aligned in a certain direction.

3. The method according to claim 2, wherein the two or more electrodes that are electrically short-circuited are arranged in a direction crossing the spontaneous polarization axes.

4. The method according to claim 1, wherein, at a time of the heat treatment in the first step, the piezoelectric material has a maximum reaching temperature higher than the Curie temperature Tc of the piezoelectric material.

5. The method according to claim 1, wherein the electrical opening of the short circuit of the electrodes in the second step is performed at a time when the temperature of the piezoelectric material decreases to (Tc/2) or less.

6. The method according to claim 1, wherein the piezoelectric material forming the piezoelectric element exhibits an absolute value $d_{after}$ of a piezoelectric constant, which is 80% or more of an absolute value $d_{before}$ of the piezoelectric constant before the heat treatment of the piezoelectric material.

7. The method according to claim 1, wherein the piezoelectric material comprises a lead-free material.

8. The method according to claim 7, wherein the piezoelectric material comprises a metal oxide containing barium titanate as a main component.

9. The method according to claim 7, wherein the piezoelectric material comprises a metal oxide containing a solid solution of sodium niobate and barium titanate.

10. The method according to claim 1, wherein the two or more electrodes are electrically short-circuited through intermediation of a flexible printed board.

11. A method of manufacturing an oscillatory wave motor, comprising:
   arranging a piezoelectric element manufactured by the method of claim 1 on a vibration member; and
   bringing a moving member into contact with the vibration member.

12. A method of manufacturing an optical apparatus, comprising dynamically connecting an optical member to the moving member of an oscillatory wave motor manufactured by the method of claim 11.

13. A method of manufacturing an electronic apparatus, comprising arranging a member including a piezoelectric element manufactured by the method of claim 1.

14. The method according to claim 1, wherein the piezoelectric material is subjected to the heat treatment at a temperature higher than the Curie temperature Tc of the piezoelectric material in the first step.

* * * * *